United States Patent
Milot

(10) Patent No.: US 11,038,524 B2
(45) Date of Patent: Jun. 15, 2021

(54) CONVOLUTIONS OF DIGITAL SIGNALS USING A BIT REQUIREMENT OPTIMIZATION OF A TARGET DIGITAL SIGNAL

(71) Applicant: ACOUSTICAL BEAUTY, Vaas (FR)

(72) Inventor: Gilles Milot, Paris (FR)

(73) Assignee: ACOUSTICAL BEAUTY, Vaas (FR)

( * ) Notice: Subject to any disclaimer, the term of this patent is extended or adjusted under 35 U.S.C. 154(b) by 0 days.

(21) Appl. No.: 16/756,241

(22) PCT Filed: Oct. 15, 2018

(86) PCT No.: PCT/EP2018/077990
§ 371 (c)(1),
(2) Date: Apr. 15, 2020

(87) PCT Pub. No.: WO2019/076781
PCT Pub. Date: Apr. 25, 2019

(65) Prior Publication Data
US 2020/0321975 A1 Oct. 8, 2020

(30) Foreign Application Priority Data

Oct. 16, 2017 (EP) .................................... 17306401
Jan. 8, 2018 (EP) .................................... 18305011

(51) Int. Cl.
*H03M 1/66* (2006.01)
*H03M 7/30* (2006.01)
*G06F 17/15* (2006.01)
*H03M 1/70* (2006.01)
*G10L 19/24* (2013.01)

(52) U.S. Cl.
CPC .......... *H03M 7/3073* (2013.01); *G06F 17/15* (2013.01); *H03M 1/70* (2013.01); *H03M 7/3059* (2013.01); *G10L 19/24* (2013.01)

(58) Field of Classification Search
CPC ............................. H03M 7/3073; H03M 1/70
USPC ....................... 341/50, 59, 61, 144, 155, 143
See application file for complete search history.

(56) References Cited

U.S. PATENT DOCUMENTS

| | | |
|---|---|---|
| 4,229,800 A | 10/1980 | Gregorian et al. |
| 4,818,996 A | 4/1989 | Kimura |
| 6,243,729 B1 | 6/2001 | Staszewski |

(Continued)

FOREIGN PATENT DOCUMENTS

GB 2507096 A 4/2014

OTHER PUBLICATIONS

International Search Report and Written Opinion for PCT/EP2018/077990, dated Jan. 15, 2019.

*Primary Examiner* — Peguy Jean Pierre
(74) *Attorney, Agent, or Firm* — Meagher Emanuel; Laks Goldberg & Liao, LLP

(57) ABSTRACT

The invention relates to improved convolutions of digital signals. When a first digital signal is convoluted with a second digital signal to obtain an output digital signal, to be converted afterwards using a limited number of bits. In order to prevent a loss of information, and therefore a degradation of the output digital signal upon the future conversion, at least one of the first and the second digital signal is formed of suitable values that store the information from the first digital signal within the most significant bits of the output digital signal.

20 Claims, 16 Drawing Sheets

(56) References Cited

U.S. PATENT DOCUMENTS

| | | | |
|---|---|---|---|
| 6,362,764 B1 | 3/2002 | Niimi et al. | |
| 6,505,221 B1 | 1/2003 | Maschmann | |
| 9,391,576 B1 | 7/2016 | Satoskar | |
| 2007/0234186 A1* | 10/2007 | Mo | H04L 1/0068 |
| | | | 714/790 |
| 2020/0372340 A1* | 11/2020 | Lee | G06N 3/08 |
| 2020/0389182 A1* | 12/2020 | Li | G06F 7/5443 |

* cited by examiner

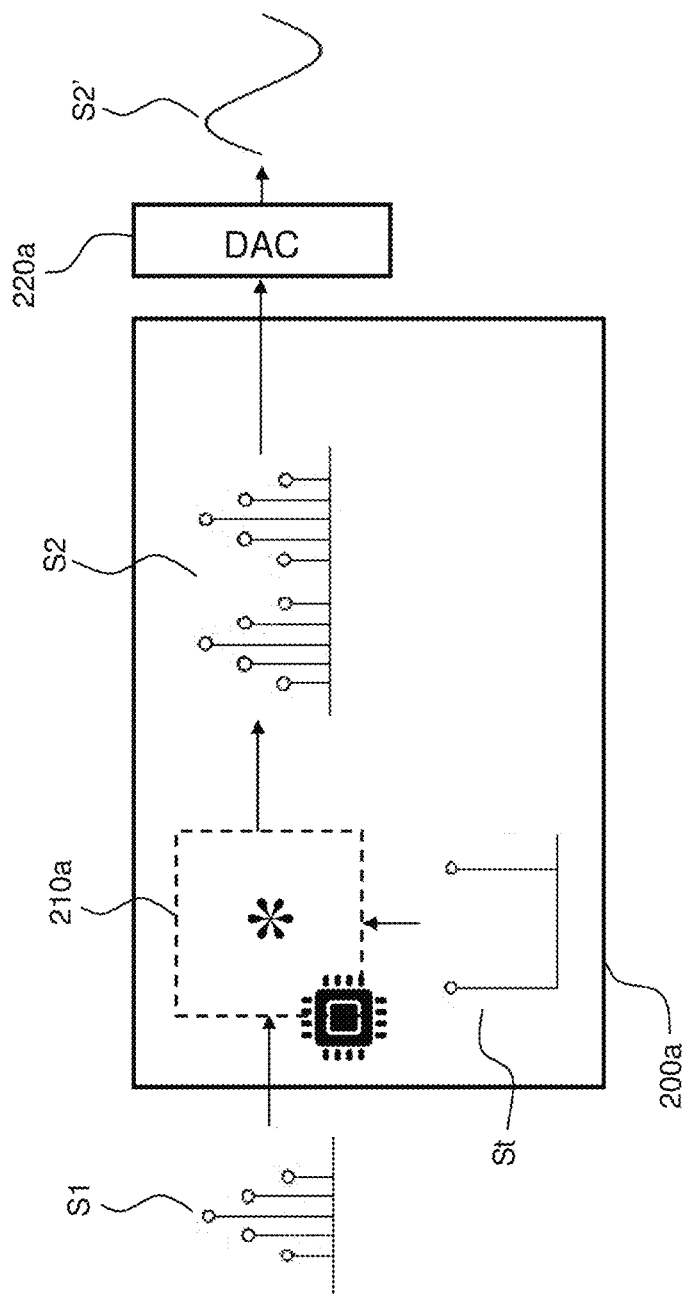

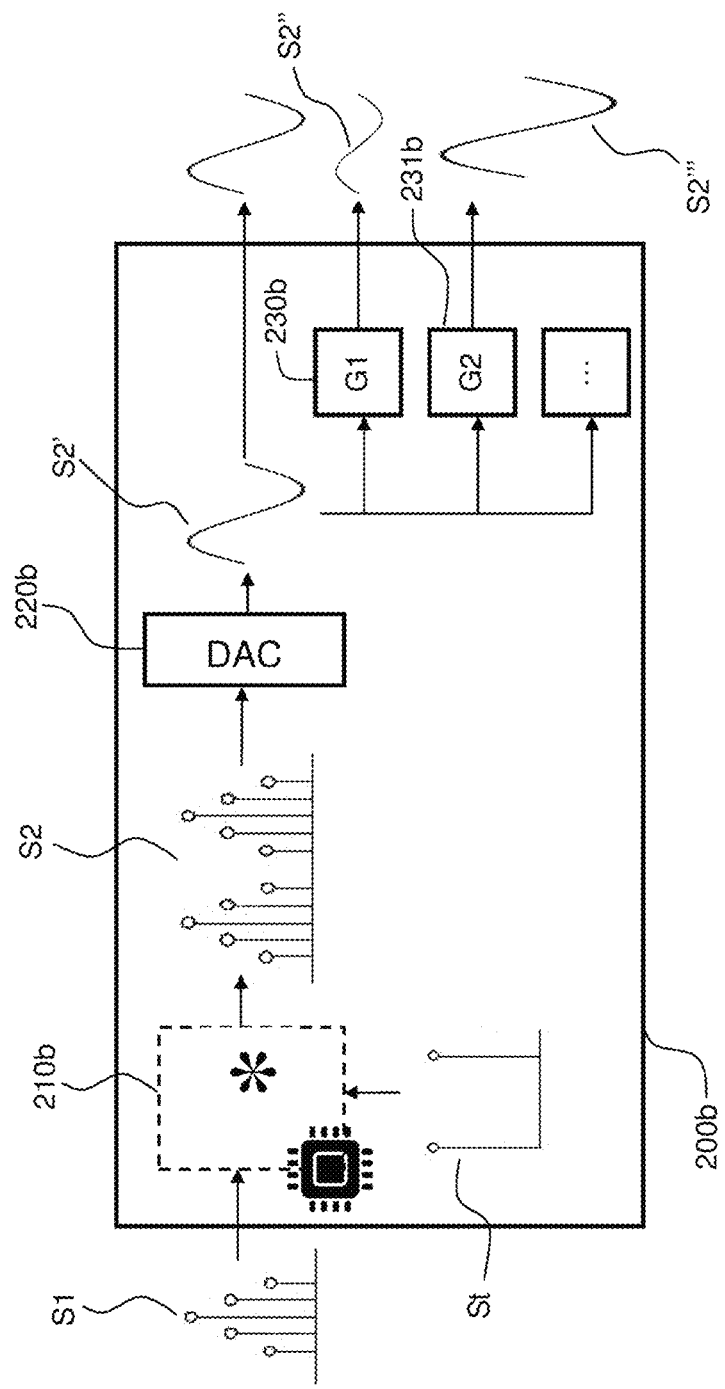

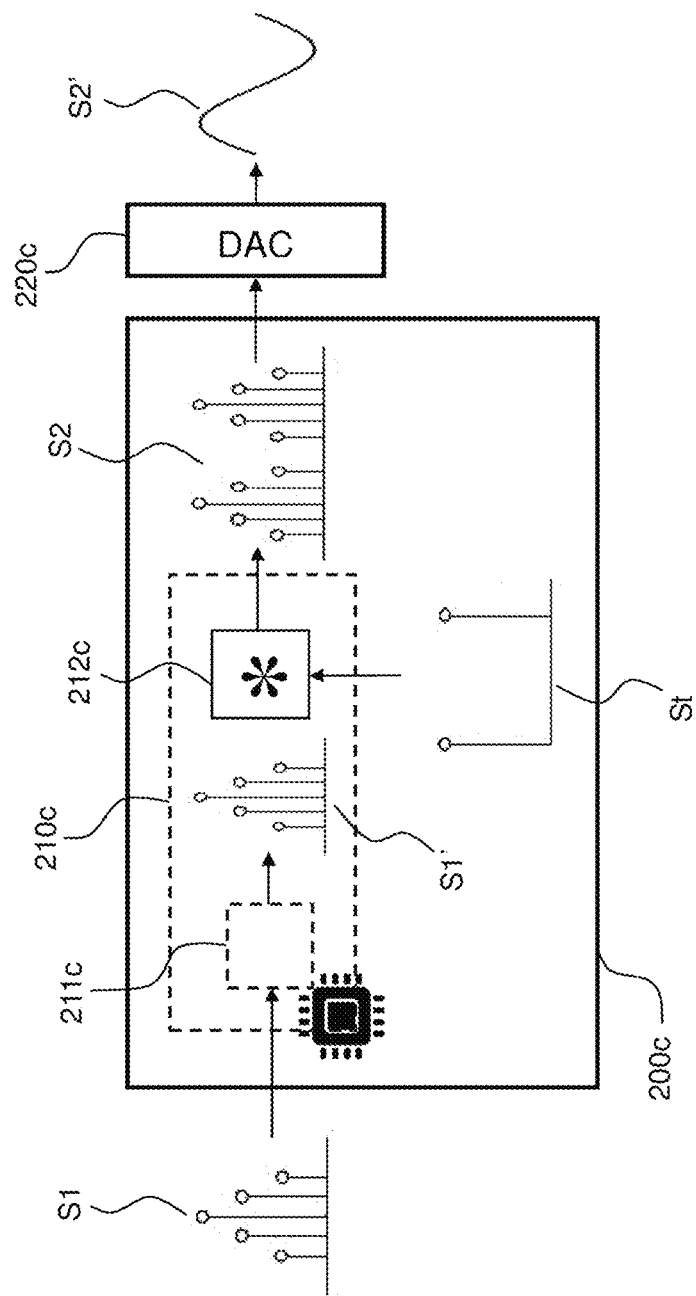

CONVOLUTIONS OF DIGITAL SIGNALS USING A BIT REQUIREMENT OPTIMIZATION OF A TARGET DIGITAL SIGNAL

FIELD OF THE INVENTION

The present invention relates to the field of digital signal processing. More specifically, it relates to digital circuitry to apply transfer functions, filter, and more generally modify input digital signal.

BACKGROUND PRIOR ART

Nowadays signals are commonly represented, used and modified in a digital form. It is for example the case of visual or image signals, which are usually represented in the form of digital matrixes representing the amplitude of luminosity of pixels for one or more color layers, and for audio signals, which are usually represented, for one or more audio channels, by a succession of temporal samples of amplitude of an audio track on each audio channel.

In a large number of applications, digital signals can be modified. This is for example the case when one wishes to change the amplitude of an audio signal, modify the luminosity or contrast of an image, or more generally perform a filter on a signal. Signal filtering can be performed for a large number of applications, for example to perform a denoising, to adapt an audio signal to be listened to, or more generally to apply any kind of effects on the signal.

In practice, the modification of a digital signal is usually performed by a convolution with another digital signal. The convolution consists in multiplications and additions of values of the two signals over a time window to obtain a modified signal. The simplest case of convolution consists in simply multiplying the samples of an input digital signal by a single coefficient to apply a change of amplitude to the input digital signal and thus obtain an amplified or attenuated output digital signal.

In a number of other examples of filters, such as a denoising filter, low-pass filters, high-pass filters, etc. . . . a filter may theoretically be applied on an input digital signal by convoluting the input digital signal and a signal representative of the filter over a time window of infinite size. However, in most cases the convolution is restricted to a window of finite size. A filter defined by multiplying coefficients over a window of finite size is called a Finite Impulse Response (FIR) filter. The application of such a filter on an impulse, or Dirac delta function, generates an output signal called impulse response of the filter, which is formed of samples whose amplitudes are respectively equal to the coefficients of the filter.

A digital signal is formed of samples which are stored on a number of bits, called bit depth of the signal. For example, an audio signal usually has a bit depth of 16 or 24 bits, while an image signal usually has a bit depth comprised between 8 and 16 bits. When a filter, transform, transfer function, or convolution is applied to an input digital signal, the resulting output digital signal usually has a bit depth higher than the bit depth of the input digital signal, in order to preserve as much information as possible from the input digital signal, and the transform. For example, the result of an attenuation of a 16 bit input digital signal can be stored on 24, or even 32 bits, in order to have as much precision as possible in the output digital signal.

The number of bits which are commonly used by computing capacities for calculating operations is generally much higher than the number of bits which are used to store digital signals. For example, most processors perform operations on 32 or 64 bits, while most audio signal have a bit depth of 16, and most image signals a bit depth of 8. This property is used by digital signal processing systems, to obtain a precision as high as possible for filtering. For example, an attenuation of a signal is usually expressed in dB. A commonplace operation of audio processing consists of applying a gain, expressed in dB, to audio signals. The number of bits allowed by processing capabilities is widely used to obtain very precise values of amplitude change of an audio signal. In a similar manner, when applying a FIR filter, a maximum number of bits is used, in order to obtain an impulse response of the FIR filter which is as close as possible to a theoretical/ideal impulse response.

However, such an output signal needs to be converted in order to be sensed by a user. For example, the conversion of an audio output digital signal can be performed by a Digital-to-Analog Converter (DAC) that converts the output digital signal to an analog signal to be listened to using loudspeakers. An image output digital signal can be viewed for example by activating pixels with level of luminosity defined by the values of samples of the output digital signal.

It shall be noted that such a conversion, to allow a user to sense the output digital signal, is itself performed using a defined number of bits. For example, most audio DACs, although converting audio samples having a bit depth up to 24 bits, actually convert an audio digital signal using a lower bit depth, for example 21 bits. Thus, when the audio digital signal is converted to an audio analog signal to be listened to, the performances of such DACs correspond roughly to the 21 most significant bits of the audio digital signal. This loss of information induces a degradation of the audio signal, which may alter significantly the quality of audio listening.

Similar degradation can occur when converting other types of digital signals, for example digital image signals, after the application of transforms that increase the number of bits.

However, when applying a filer on a signal, such loss of information caused by the conversion of the digital signal may affect not only the signal itself, but also the response of the filter.

There is therefore the need for a device which is able to perform transformations of a digital signal such as changes of amplitude or filtering, while reducing the degradation perceived by a user of said digital signal upon a future conversion of said digital signal using a limited number of bits. There is also the need for a device which is able to perform transformations of a digital signal, while reducing the degradation perceived by a user of the transformation, upon a future conversion of said digital signal using a limited number of bits.

SUMMARY OF THE INVENTION

To this effect, the invention discloses a digital circuitry configured to perform a convolution of an input digital signal and a digital signal representative of a transform to obtain an output digital signal, at least one of said input digital signal and said digital signal representative of a transform comprising one or more samples obtained by a bit requirement optimization of a target digital signal.

Advantageously, the transform (St) is an oversampling of the input digital signal.

Advantageously, said bit requirement optimization comprises the definition of a value a sample of said at least one of said input digital signal and said digital signal representative of a transform as a division of a first integer number by two raised to the power of a second integer number.

Advantageously, said second integer number is comprised between a minimum number (K) and a maximum number (K+D) and is equal to an increasing function of the absolute value of a difference between the conversion of the sample to a representation using the minimum number of bits.

Advantageously, said second integer number is comprised between a minimum number (K) and a maximum number (K+D) and is equal to an increasing function of the absolute value of a difference between the conversion of the sample to a representation using the minimum number of bits divided by the value of the sample.

Advantageously, said decreasing function defines a number of bits equal of below a maximum number of bits.

Advantageously, the decreasing function is a number of bits of precision minus a binary logarithm of the absolute value of said absolute value of the target sample of the target digital signal.

Advantageously, the number of bits of precision is defined according to a target precision of the transform.

Advantageously, the value of the bit requirement optimization comprises the selection of the value of the sample among a set of suitable values based on the target value of the target sample.

Advantageously, the number of bits of precision is equal to a ceiling of a binary logarithm of a target number of suitable values in a range having the form $]½^{N+1}; ½^N]$.

Advantageously, the number of suitable values in a range having the form $]½^{N+1}; ½^N]$ is equal to 6 divided by an average target step between two suitable values, in dB.

Advantageously, the set of suitable values is further defined by a maximum suitable value, and comprises: two raised to the power of the number of bits of precision values, respectively equal to: a first integer value from 1 to two raised to the power of the number of bits of precision divided by two raised to the power of the maximum number of bits; for each range in a plurality of ranges defined by a second integer value comprised between a binary logarithm of said maximum suitable value and the maximum number of bits minus one: two raised to the power of the number of bits of precision minus one values, respectively equal to: a first integer value from one plus two raised to the power of the number of bits of precision minus one to two raised to the power of the number of bits of precision divided by two raised to the power of the second integer value.

Advantageously, said at least one of said an input digital signal and a digital signal representative of the transform comprises a plurality of samples; each sample is associated to a number of bits of precision depending of a precision required by said sample; the value of each sample is selected among a discrete set of suitable values defined at least by the number of bits of precision associated to said sample.

Advantageously, the digital signal representative of the transform comprises a single sample, representative of a coefficient of amplitude change to be applied to the input digital signal.

Advantageously, the digital circuitry is configured to: determine a maximum absolute value of said input digital signal on a time window; calculate a maximum coefficient of amplitude change based on said maximum absolute value and a predefined maximum coefficient of saturation; select the value of said single sample in said set of suitable values which is representative of a coefficient of amplitude change below said maximum coefficient of amplitude change which is the closest to a target coefficient of amplitude change.

Advantageously, the values of the one or more samples are selected among the suitable values according to target values of samples of the target digital signal and a rule of selection of suitable values.

Advantageously, the rule of selection selects the suitable values which are the closest to the target values.

Advantageously, the rule of selection selects the suitable values based on a combination of an error between target and suitable values, and an additional number of bits required by suitable values.

Advantageously, the rule of selection first selects a candidate suitable value which is the closest to a target value; if the first integer number for the candidate suitable value is an odd number, the rule of selection selects, if it exists, a suitable value in the set of suitable values which is a neighbor of the candidate suitable value, and whose first integer number is a multiple of 4.

Advantageously, the rule of selection: adds a first suitable value which is the closest to a target value to an empty list of candidate values; iteratively, for each candidate value added to the list of candidate values: defines the candidate value as a division of a first odd integer number divided by two raised to the power of a second integer number; verifies if a first additional value equal the first odd integer number plus one divided by two raised to the power of a second integer number is within an error range around the target value; if it is, adds the first additional value to the list of candidate values; verifies if a second additional value equal the first odd integer number minus one divided by two raised to the power of a second integer number is within an error range around the target value; if it is, adds the second additional value to the list of candidate values; selects the candidate value in the list of candidate values, which is defined as a first odd integer number divided by two raised to the power of a second integer number, said second integer number being the lowest among candidate values.

Advantageously, the input digital signal has an input bit depth, and said output digital signal has an output bit depth, higher than or equal to the input bit depth.

Advantageously, the values of samples of the digital signal representative of the transform are integer values, said digital circuitry being configured to perform a full scale conversion of a sample of the input digital signal into a converted sample having the output bit depth, and multiply the converted sample by one or more samples of the digital signal representative of the transform.

Advantageously, the values of samples of the digital signal representative of the transform are integer values equal to the value of the suitable coefficients multiplied by two raised to a power of the difference between said output bit depth and said input bit depth, said digital circuitry being configured to perform a conversion of a sample of the input digital signal into a converted sample having the output bit depth, and multiply the converted sample by values of the samples of the digital signal representative of the transform.

The invention also discloses a device comprising: the digital circuitry of the invention; a connection to a digital-to-analog converter, said digital-to-analog converter being configured to convert said output digital signal to a digital output digital signal to an output analog signal using a conversion accuracy comprised between said input bit depth and said output bit depth.

Advantageously, the device further comprises a connection to one or more attenuators or amplifiers to apply an amplitude change to the output analog signal using a fixed gain or a variable gain with a finite number of possible values.

The invention also discloses a method of convolution of an input digital signal and a digital signal representative of a transform to obtain an output digital signal, at least one of said input digital signal and said digital signal representative of a transform comprising one or more samples obtained by a bit requirement optimization of a target digital signal.

The invention also discloses a computer program comprising computer code instructions configured to perform a convolution of an input digital signal and a digital signal representative of a transform to obtain an output digital signal, at least one of said input digital signal and said digital signal representative of a transform comprising one or more samples obtained by a bit requirement optimization of a target digital signal.

The invention also discloses a method of creation of a first digital signal to be convolved with a second digital signal, comprising a bit requirement optimization of a target digital signal.

The invention also discloses a digital circuit configured to perform a convolution of an input digital signal and a digital signal representative of a transform to obtain an output digital signal, at least one of said input digital signal and said digital signal representative of a transform comprising one or more samples whose values belong to a discrete set of suitable values, wherein: said discrete set of suitable values is defined at least by a decreasing function defining a number of bits as a function of the absolute values of said suitable values; suitable value is equal to a division of a first integer number by two raised to the power of a second integer number, said second integer number being equal to or below a ceiling of the application of the decreasing function to the absolute value of said suitable value.

Advantageously, said discrete set of suitable values is further defined by a maximum number of bits; each second integer number for each suitable coefficient is equal to or below said maximum number of bits.

Advantageously, the decreasing function is a number of bits of precision minus a binary logarithm of the absolute value of said suitable value.

Advantageously, the number of bits of precision is defined according to a target precision of the transform.

Advantageously, the number of bits of precision is equal to a ceiling of a binary logarithm of a target number of suitable values in a range having the form $]½^{N+1}; ½^N]$.

Advantageously, the number of suitable values in a range having the form $]½^{N+1}; ½^N]$ is equal to 6 divided by an average target step between two suitable values, in dB.

Advantageously, the set of suitable value is further defined by a maximum suitable value, and comprises: two raised to the power of the number of bits of precision values, respectively equal to: a first integer value from 1 to two raised to the power of the number of bits of precision divided by two raised to the power of the maximum number of bits; for each range in a plurality of ranges defined by a second integer value comprised between a binary logarithm of said maximum suitable value and the maximum number of bits minus one: two raised to the power of the number of bits of precision minus one values, respectively equal to: a first integer value from one plus two raised to the power of the number of bits of precision minus one to two raised to the power of the number of bits of precision divided by two raised to the power of the second integer value.

Advantageously, one of said an input digital signal and a digital signal representative of the transform comprises a plurality of samples; each sample is associated to a number of bits of precision depending of a precision required by said sample; the value of each sample belongs to a discrete set of suitable values defined at least by the number of bits of precision associated to said sample.

Advantageously, the digital signal representative of the transform comprises a single sample, representative of a coefficient of amplitude change to be applied to the input digital signal.

Advantageously, the digital circuitry is configured to: determine a maximum absolute value of said input digital signal on a time window; calculate a maximum coefficient of amplitude change based on said maximum absolute value and a predefined maximum coefficient of saturation; select the value of said single sample in said set of suitable values which is representative of a coefficient of amplitude change below said maximum coefficient of amplitude change which is the closest to a target coefficient of amplitude change.

Advantageously, the values of the one or more samples are selected among the suitable values according to target values and a rule of selection of suitable values.

Advantageously, the rule of selection selects the suitable values which are the closest to the target values.

Advantageously, the rule of selection selects the suitable values based on a combination of an error between target and suitable values, and an additional number of bits required by suitable values.

Advantageously, the rule of selection first selects candidate suitable value which is the closest to a target value; if the first integer number for the candidate suitable value is an odd number, the rule of selection selects, if it exists, a suitable value in the set of suitable values which is a neighbor of the candidate suitable value, and whose first integer number is a multiple of 4.

Advantageously, the rule of selection: adds a first suitable value which is the closest to a target value to an empty list of candidate values; iteratively, for each candidate value added to the list of candidate values: defines the candidate value as a division of a first odd integer number divided by two raised to the power of a second integer number; verifies if a first additional value equal the first odd integer number plus one divided by two raised to the power of a second integer number is within an error range around the target value; if it is, adds the first additional value to the list of candidate values; verifies if a second additional value equal the first odd integer number minus one divided by two raised to the power of a second integer number is within an error range around the target value; if it is, adds the second additional value to the list of candidate values; selects the candidate value in the list of candidate values, which is defined as a first odd integer number divided by two raised to the power of a second integer number, said second integer number being the lowest among candidate values.

Advantageously, the input digital signal has an input bit depth, and said output digital signal has an output bit depth, higher than or equal to the input bit depth.

Advantageously, the values of samples of the digital signal representative of the transform are integer values, said digital circuitry being configured to perform a full scale conversion of a sample of the input digital signal into a converted sample having the output bit depth, and multiply the converted sample by one or more samples of the digital signal representative of the transform.

Advantageously, the values of samples of the digital signal representative of the transform are integer values equal to the value of the suitable coefficients multiplied by two raised to a power of the difference between said output bit depth and said input bit depth, said digital circuitry being configured to perform a conversion of a sample of the input digital signal into a converted sample having the output bit depth, and multiply the converted sample by values of the samples of the digital signal representative of the transform.

The invention also discloses a device comprising: a digital circuit of the invention; a connection to a digital-to-analog converter, said digital-to-analog converter being configured to convert said output digital signal to a digital output digital signal to an output analog signal using a conversion accuracy comprised between said input bit depth and said output bit depth.

Advantageously, the device comprises a connection to one or more attenuators or amplifiers to apply an amplitude change to the output analog signal using a fixed gain or a variable gain with a finite number of possible values.

The invention also discloses a method of convolution of an input digital signal and a digital signal representative of a transform to obtain an output digital signal, at least one of said input digital signal and digital signal representative of a transform comprising one or more samples whose values belong to a discrete set of suitable values, wherein: said discrete set of suitable values is defined at least by a decreasing function defining a number of bits as a function of the absolute values of said suitable values; each suitable value is equal to a division of a first integer number by two raised to the power of a second integer number, said second integer number being equal to or below a ceiling of the application of the decreasing function to the absolute value of said suitable value.

The invention also discloses a computer program product comprising computer code instructions configured to perform a convolution of an input digital signal and a digital signal representative of a transform to obtain an output digital signal, at least one of said input digital signal and digital signal representative of a transform comprising one or more samples whose values belong to a discrete set of suitable values, wherein: said discrete set of suitable values is defined at least by a decreasing function defining a number of bits as a function of the absolute values of said suitable values; each suitable value is equal to a division of a first integer number by two raised to the power of a second integer number, said second integer number being equal to or below a ceiling of the application of the decreasing function to the absolute value of said suitable value.

The invention also discloses a method of creation of a first digital signal to be convolved with a second digital signal, comprising: obtaining target values of samples the first digital signal; for each target value of a sample, selecting a suitable value belonging to a set of suitable values, wherein: said discrete set of suitable values is defined at least by a decreasing function defining a number of bits as a function of the absolute values of said suitable values; each suitable value is equal to a division of a first integer number by two raised to the power of a second integer number, said second integer number being equal to or below a ceiling of the application of the decreasing function to the absolute value of said suitable value; setting the value of the sample to the suitable value.

The invention greatly improves the perception by a user of a digital signal, and/or a transform thereof.

The invention is applicable to any system that performs a convolution of two digital signals, in order to improve the perception by a user of the resulting digital signal.

The invention can be tailored to provide a compromise between the improvement of the perception of the user of one of the two digital signals that are being convolved, and the closeness of the second signal to a target digital signal.

The invention can be adapted to the numbers of bits of an input and output digital signal, and a number of bits for converting the output digital signal.

BRIEF DESCRIPTION OF THE DRAWINGS

The invention will be better understood and its various features and advantages will emerge from the following description of a number of exemplary embodiments provided for illustration purposes only and its appended figures in which:

FIGS. 2a, 2b and 2c display three examples of a device in a number of embodiments of the invention;

DETAILED DESCRIPTION OF THE INVENTION

Figure 1A:
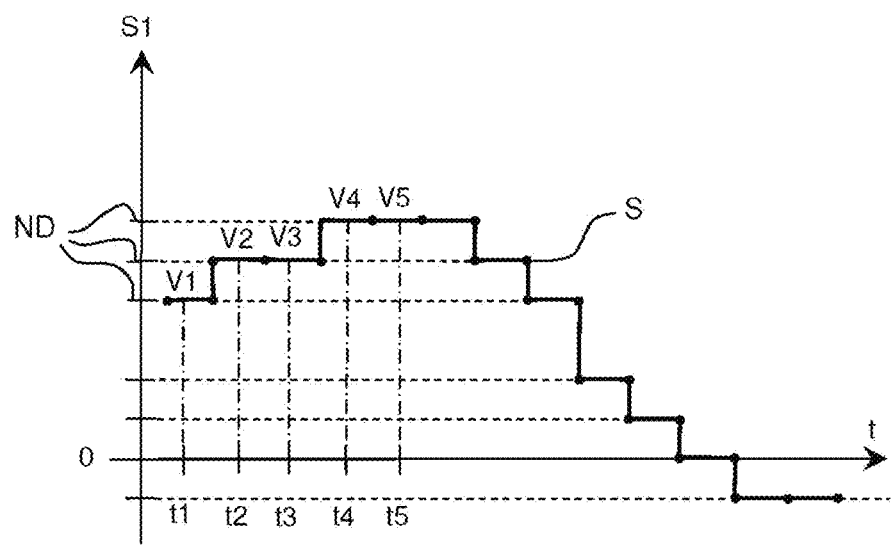
FIGS. 1a and 1b display respectively two digital signals.
Figure 1B:
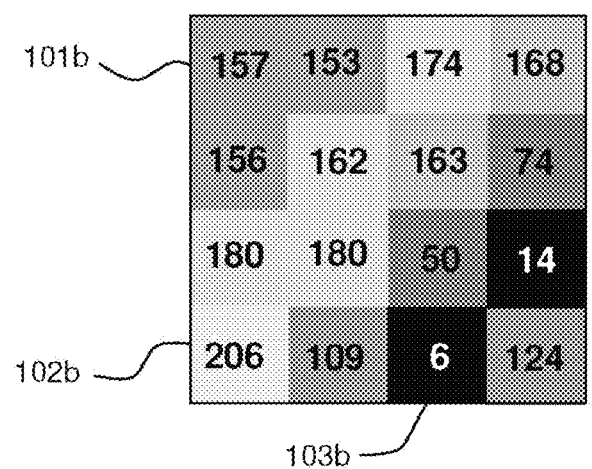

FIGS. 1a and 1b display respectively two digital signals.

FIG. 1a represents schematically a first digital signal S.

The signal S1 is defined by a plurality of successive temporal values called samples, each sample having a value or amplitude. The signal itself, as a whole, has an amplitude which can refer in particular to the difference between a maximum value and a minimum value (possibly negative) exhibited by this signal, half this difference, or else an average of the absolute values of the values exhibited by this signal.

The first signal S1 exhibits a succession of samples defining the amplitude of the signal at successive times $t1$, $t2$, $t3$, $t4$, $t5$ . . . . The successive times can be sampled at different frequencies. For example, an audio signal can be sampled at 22050 Hz (22050 samples per second), 24000 Hz, 44100 Hz, 48000 Hz, 88200 Hz, or 96000 Hz.

The first signal S1 is represented in digital form, so that each sample at times $t1$, $t2$, $t3$, $t4$, $t5$ has a value or amplitude $V1$, $V2$, $V3$, $V4$, $V5$, . . . and is each equal to a discrete level ND. The number of discrete levels that may depends on the representation of each samples. A number of different representations of the signal S1 are possible.

For example, the samples of the signal S1 can be represented using a signed 16 bits integer, that is to say using integer values ranging from −32 768 (−1×$2^{15}$) to 32 767 ($2^{15}$−1), respectively corresponding to an amplitude in a scale from −1 to 1 (1−$2^{-15}$ exactly, since the highest value that can be obtained is equal to $2^{15}$−1/$2^{15}$). Similarly, the samples of the signal S1 can be represented using signed 24 bits integers, that is to say using integer values ranging from −8 388 608 (−1×$2^{23}$) to 8 388 607 ($2^{23}$−1), respectively corresponding to an amplitude in a scale from −1 to 1 (1−$2^{-23}$ exactly, since the highest value that can be obtained is equal to $2^{23}$−1/$2^{23}$). It can be generally seen that the more bits are used to represent the signal, the more precision can be obtained in the amplitudes of said signal. The 16 bits signed integer and 24 bits signed integer are respectively used to represent audio signals in 16 bits and 24 bits PCM (Pulse Code Modulation).

The samples of the signal S1 can also be represented using unsigned integers. For example, a representation using an unsigned 16 bits integer uses unsigned integer values from 0 to 65 535 ($2^{16}$−1, corresponding to hexadecimal values from 0X0000 to 0xFFFF, wherein 0x0000 corresponds to zero), and a representation using 24 bits integer uses unsigned integer values from 0 to 16 777 215 ($2^{24}$−1, corresponding to hexadecimal values from 0x000000 to 0XFFFFFF, wherein 0x000000 corresponds to zero).

These examples are provided by means of example only, and the signal S1 can be represented using unsigned or signed integer of any bit depth, provided that the bit depth used is sufficient to represent the signal with the necessary precision. The signal S1 can also be represented using discrete values which are not integers, for example floating point values.

The signal may also be represented by a floating point representation compliant with the IEEE 754 standard may be selected where a normalization step is applied to the exponent and the mantissa and the representation comprises an additional bit that is always equal to 1 and thus remains implicit.

The first signal S1 is here representative of a sound signal. The first values V1, V2, V3, V4, V5, . . . can then be values of acoustic overpressure or under-pressure, or values of an electrical voltage representing this sound signal, or else digital values, to which no particular unit is attached, which are representative of this sound signal.

As a variant, the first signal could also be representative of a luminous signal, of a radio-electrical signal, or be representative of the evolution in the course of time of the position of an object or of any other quantity.

The FIG. 1b displays an example of a digital signal representative of an image. In such a signal, the values of the samples correspond to the value of a luminosity intensity of a pixel for a color layer. The pixels are represented by their positions from a corner of the image, for example the top-left corner.

In the example of FIG. 1b, the image is formed of a single color layer with a bit depth of 8 bits. Each value thus represents an intensity of luminosity of a unique grayscale layer of the image, in a scale ranging from 0 (no luminosity—black) to 255 ($2^8$, maximum luminosity—white). In the example of FIG. 1b, the pixel 101b has a value of 157 that corresponds to a medium grey, the pixel 102b has a value of 206 that corresponds to a light grey, and the pixel 103b has a value 6 that corresponds to a very dark grey.

This example is provided by way of example only. Many other representations of pixels of an image exist. For example, the values of the pixels can be stored using a different bit depth, for example 12 or 16 bits. Similarly, the image can comprise more than one color layer. For example, the image can comprise 3 color layers corresponding to RGB (Red Green Blue) components of a color, 3 color layers corresponding to YCbCr (Luma, Chroma Blue, Chroma Red) components of an image or 4 color layers corresponding to CMYK (Cyan Magenta Yellow Key) colors of an image. In these cases, each pixel can comprise up to 3 or 4 values corresponding to the components of the image.

FIGS. 2a, 2b and 2c display three examples of devices of the invention.

The FIG. 2a represents a first example of a device according to the invention.

The device 200a is configured to apply a transform to an input digital signal S1. The input digital signal S1 can be any digital signal, notably one of the digital signals discussed with reference to the FIGS. 1a and 1b. The input digital signal S1 is characterized by a sampling frequency $f_1$ and an input bit depth $n_1$. In a number of embodiments of the invention, the sampling frequency and/or bit depth of the input digital signal may be variable over time. In such embodiments, the input digital signal S1 can be split into a succession of time windows, wherein the signal S1 has a constant sampling frequency and bit depth, and the invention can be applied separately on each time window. Similarly, the input digital signal may comprise a plurality of channels (for example, the left and right channels of a stereo audio file). In such cases, the invention can be applied in parallel to each channel.

In order to apply the transform, the device 200a comprises a processing logic 210a configured to perform a convolution of the input digital signal S1, and a digital signal St representative of the transform, in order to obtain a transformed output digital signal S2. In the course of this application the signal St will be generally referred to as the "transform signal".

The operation of convolution can be performed for example by multiplication and additions of the signals S1 and St, as explained by: https://en.wikipedia.org/wiki/Convolution. In a number of embodiments of the invention, the convolution by St corresponds to the application of a Finite Impulse Response (FIR) filter to the input digital signal S1, as explained for example in https://en.wikipedia.org/wiki/Finite_impulse_response. In such cases, the value of each sample of St corresponds to a coefficient of a FIR filter and, when the input digital signal S1 is a Dirac, the output digital signal S2 is the impulse response of the FIR filter, that is to say each sample of S2 is equal to a sample of St, i.e. a coefficient of the FIR.

As will be discussed in more details below, the transform may be any kind of transform of the input digital signal S1. For example, the transform may apply to the input digital signal S1 a filter such as a low-pass, high-pass, denoising filter, or any other kind of filter. In a number of embodiments of the invention, the signal St comprises a single sample, representative of a coefficient of amplitude change of the input digital signal S1. In such embodiments, the device 200a is configured to perform an attenuation or an amplification of the input digital signal S1.

In this application, a processing logic may be a processor operating in accordance with software instructions, a hardware configuration of the processor, or a combination thereof. The processing logic may also be a specific-purpose processing logic such as a DSP (Digital Signal Processor) or a FPGA (Field Programmable Gate Array). It should be understood that any or all of the functions discussed herein may be implemented in a pure hardware implementation and/or by a processor operating in accordance with software instructions and/or by a processor operating in accordance with software instructions, and a configuration of a machine learning engine or neural network. A processing logic may also be a multi-core processor executing operations in parallel, a series of processors, or a combination thereof. It should also be understood that any or all software instructions may be stored in a non-transitory computer-readable medium. The term "configuration of a processing logic" refers to any means (for example hardware configuration, software instructions, machine learning, training or neural network, or any other adaptation means or combination thereof) of configuring a processing logic to execute operations. The processing logic may also be referred to as "digital circuitry".

The output digital signal S2 is further supplied to a Digital to Analog Converter (DAC) 220a, in order to be transformed into an analog digital signal S2'. The analog digital signal S2' can be sensed directly or indirectly by a user or a further device. For example, if the signals are audio signals, the analog output signal S2' can be supplied to loudspeakers in order for the audio track to be listened to by a user.

In the embodiment displayed in FIG. 2a, the conversion is performed using the external DAC 220a, in order to obtain an analog output signal S2'. However, the invention is not restricted to this example. For example, the conversion may be performed using a DAC within the device 200a.

In other embodiments of the invention, the output digital signal can also be converted into further digital output signal using a digital converter using a conversion having a bit depth lower than the bit depth of the output digital signal instead of being converted into a digital output signal using the DAC 220a. It is for example the case when an audio signal is to be sent in digital form to an audio device using a wireless transmission protocol. An example of such system is the Apple Airplay™ system, wherein to audio stream is typically transmitted in digital form using 16 bits samples at a frequency of 44.1 kHz. If the output digital signal S2 has a bit depth higher than 16 bits, information from the input digital signal S1 may be lost, for the same reason than when using DACs.

The signal St representative of the transform has a bit depth $n_t$, and the output digital signal an output bit depth $n_2$. The input digital signal S1, transform signal St and output digital signal S2 can be stored in order to perform the convolutions on memories of the device 200a according to their respective bit depths.

In an exemplary device to perform attenuations of an audio signal, the input digital signal S1 has a bit depth of 16, the transform digital signal St comprises a single sample has a bit depth of 8, and the output digital signal has a bit depth of 23 or 24 bits (23 bits (22 bits of data+1 bit of sign) if both the input digital signal and the transform digital signal are signed integer, 24 bits otherwise), and is obtained by a multiplication of the input digital signal S1 by the unique sample of the transform digital signal St.

The DAC 220a converts the output digital signal S2 into a transformed output digital signal S2' using an accuracy, in terms of number of bits, that will be defined hereinafter as the "conversion accuracy". Most of DACs for audio applications currently on the market, although taking as input signals up to 24 bits, have a lesser conversion accuracy, for example 21 bits. In the example of the FIG. 2a, the DAC 220a has a conversion accuracy of 21 bits, which means that the output analog audio signal D2', although being be created based on the 24 bits of the output digital signal S2, is able to faithfully reproduce only the 21 most significant bits of D2.

As explained above, in prior art systems, when a convolution is performed to apply a function, as many bits as possible are used, in order to have a definition of a transform as precise as possible. For example, in a prior art device to perform a change of amplitude of an audio signals, a transform signal and output digital signal have a very large number of bits in order to perform very precise changes of amplitude. For example, prior art systems for changing amplitude of audio signals often use output digital signals having a bit depth of 24 or 32, and apply coefficients of amplitude change that are tailored to apply very precise gains, such as −30.00 dB for example. However, this implies that the information relative to the input digital signal is allocated among all bits of the output digital signal. Since the DACs usually provide a conversion accuracy corresponding to a number of bits smaller than the bit depth of the output digital signal, a large portion of the information from the input digital signal is lost, and this results in an audio track which is deteriorated. In particular, the analog output audio for such systems is subject to a distortion related to signal truncation.

This problem affects not only audio tracks, but also other kinds of digital signals, such as image signals.

In a number of embodiments of the invention, in order to overcome this issue, the samples of the transform signal St are obtained by applying an operation called "bit requirement optimization" to samples of a target transform signal. The target transform signal represents the transform signal that would be applied if the invention were not used. It corresponds for example to a representation as exact as possible of the impulse response of a filter to apply, or a coefficient of amplitude change to apply.

The bit requirement optimization consists in a modification of values of samples, in order that the values of the optimized samples can be expressed using a number of bits as low as possible. Thus, when samples of another signal are multiplied by or convolved with the optimized samples, the result of the operation is stored in the most significant bits of the output digital signal. For example, if a gain is applied to an input digital signal having a bit depth of 16 bits, by multiplying such input digital signal by a transform signal comprising an integer coefficient having a bit depth of 8 bits results in an output digital signal having a bit depth of 24 bits. A target sample of the transform coefficient has a target value of 129, corresponding to a coefficient of gain 129/256. The target value 129 corresponds to a binary value 10000001 and requires 8 bits to be expressed. Therefore, the multiplication of the input digital signal by the coefficient 129/256 requires 8 additional bits to be expressed without errors.

A bit requirement optimization of the transform digital signal may consist in replacing the value of gain 129/256 by 128/256, that corresponds to a binary value 10000000 and requires 8 bits to be expressed. Therefore, such optimized coefficient has a value which is very close to the target coefficient, but requires only one bit to be expressed. Therefore, the multiplication of the input digital signal by the optimized coefficient 128/256 requires only 1 additional bit to be expressed without errors. This does not significantly affect the transform applied to the input digital signal, but significantly reduces a loss of information when converting the output digital signal using a limited number of bits.

In a number of embodiments of the invention, the bit requirement optimization of the transform signal is dependent upon the values of the target transform signal. Indeed, the precision required to express the values may depend on the values of the target transform signal. More specifically, values very close to zero, corresponding to very low gains, may be expressed with a higher precision, and thus a higher number of additional bits, than higher values.

The bit requirement optimization of the transform signal may also depend upon a required precision of samples of the transform signal.

FIG. 2a represents an example in which the transform signal is obtained by a bit requirement optimization of a target transform signal, in order to preserve information from the input digital signal. In other embodiments of the invention, the input digital signal is obtained by a bit requirement optimization of a target input digital signal in order to preserve information from the transform digital signal, or the input digital signal and the transform digital signal are obtained respectively by a bit requirement optimization of a target input digital signal and a bit requirement optimization of a target transform digital signal, in order to preserve information from both the input digital signal and the transform digital signal.

An example of bit requirement optimization consists in selecting the values of the samples of the transform signal St in order to be able to perform the transformations which are required, while retaining as much information as possible from the input digital signal S1 in the most significant bits of the output digital signal S2, in order for this information to be preserved upon conversion by the DAC 220a.

In order to do so, the transform signal St comprises one or more samples whose values belong to a discrete set of suitable values, which is defined at least by a decreasing function defining a number of additional bits as a function of the absolute values of said suitable values. Each suitable value is equal to a division of a first integer number by two raised to the power of a second integer number, said second integer number being equal to or below a ceiling of the application of the growing function to the absolute value of said suitable values.

Thus, the transform signal St is formed of suitable coefficients, that can be expressed on the form $$\frac{k}{2^n},$$

wherein k is an integer, and n is defined as a decreasing function of the suitable coefficients in the form $$\frac{k}{2^n}.$$

The formulation of a coefficient of the transform signal St as $$\frac{k}{2^n}$$

will be employed through this description. Indeed, an interesting property of this formulation is that is allows a characterization of the number of bits required to preserve all information of the input digital signal. By means of example, if the input digital signal has an input bit depth $n_1=16$, and is multiplied by a factor $3/2^4$, all information of the input digital signal can be stored using integer values represented on 16+4=20 bits. If the output digital signal S2 has a bit depth n2=24 bits, and the DAC 220a provides a conversion accuracy of 21 bits, it can be appreciated that, the information from the input digital signal S1 being comprised within the 20 most significant bits of S2 after the application of the transform, the output analog signal S2' will contain all information from S1, thereby avoiding the above mentioned issues in the output analog signal S2'.

Now, if in the same configuration the input digital signal S1 is multiplied by a factor $3/2^6$, all information of the input digital signal can be stored using integer values represented on 16+6=22 bits in the output digital signal S2. Therefore, upon a conversion having an accuracy of 21 bits, there may be a little loss of information during conversion by the DAC 220a. However, this loss of information remains much smaller than a loss of information that would be created by using randomly chosen coefficient that would allocate information from the input digital signal S1 over the full range of the output digital signal S2.

The number of bits which is required by each suitable coefficient to preserve all information from the input digital signal S1 will be referred to as the "additional number of bits". An aim of the invention is to obtain an additional number of bits which is as low as possible and thus preserve as much information as possible from the input digital signal, while ensuring that a target transform can be applied with the required precision.

An important property of the suitable values of the invention is that the lower are absolute value of suitable values, the higher n can be, since the n is obtained as a growing function of the suitable values. This makes it possible to use an additional number of bits that is low for high values, and higher for lower values. Indeed, in many applications the input digital signal S1 is multiplied by low values. This is for example the case when an important attenuation is applied to an audio digital signal, thereby corresponding to a multiplication by a coefficient close to zero. It is also the case when applying FIR filters having a large number of coefficients to the input digital signal S1. In general, the values of coefficients of FIR filters decrease with the number of coefficients of the FIR.

Thus, the device 200a allows the multiplication of values of samples of the input digital signal S1 by samples having a value $$\frac{k}{2^n}$$

with a low value or n, and thus a low number of additional bits for high coefficients, and a value $$\frac{k}{2^n}$$

with a higher value or n, and thus a higher number of additional bits for low coefficients, whose absolute value is closer to zero. It is necessary to use a higher number of additional bits for low coefficients, whose absolute value is close to zero, in order to have a sufficient step between two coefficients. Thus, the information of the input digital signal S1 is preserved by using an additional number of bits as low as possible depending on the values by which the input digital signal shall be multiplied.

In a number of embodiments of the invention, the discrete set of suitable coefficients is further defined by a maximum number of bits, and each second integer number for each suitable coefficient is equal to or below said maximum number of bits.

This allows to set a boundary on the additional number of bits. For example, if the maximum number of bits is equal to 8, each suitable value can be expressed on the form $$\frac{k}{2^n},$$

with n≥8. Thus, a maximum additional number of bits of 8 is used. In the example displayed in FIG. 2a, the bit depth of the input digital signal S1 being equal to 8, using a maximum number of bits of 8 allows preserving all information from S1 within an output digital signal S2 having a bit depth of 16+8=24.

However, this limits the range of values of samples that can be used. For example, using the maximum number of bits equal to 8 means that the absolute values of all suitable coefficients are equal at least on $1/2^8$.

In a number of embodiments of the invention, the decreasing function is a number of bits of precision minus a binary logarithm of the absolute value of said suitable value.

The number of bits of precision defines a compromise between the number of additional bits used by each suitable coefficient, and the number of suitable coefficients that are available, while the use of a binary logarithm as a advantageously sets the additional number of bits depending on absolute values of the suitable coefficients.

For example, if the number of bits of precision is equal to 3:
  in a range of absolute values of suitable values of [½; 1[,
    the second integer number n can be defined so that:
    CEILING(3−log 2(½))≥n>CEILING(3−log 2(1));
    CEILING(3−(−1))≥n>CEILING(3−0);
    CEILING(4)≥n>CEILING(3);
    4≥n>3;
    Thus n=4, and the suitable values in the range]½; 1] can be chosen among values in the form $$\frac{k}{2^4}$$

in the range [½; 1], that is to say the values 9/16, 10/16, 11/16, 12/16, 13/16, 14/16, 15/16, 16/16,
  in a range of absolute values of suitable values of]¼; ½],
    the second integer number n can be defined so that:
    CEILING(3−log 2(¼))≥n>CEILING(3−log 2(½));
    CEILING(3−(−2))≥n>CEILING(3−(−1));
    CEILING(5)≥n>CEILING(4);
    5≥n>4;
    Thus n=5, and the suitable values in the range]¼; ½] can be chosen among values in the form $$\frac{k}{2^5}$$

in the range]¼; ½], that is to say the values 9/32, 10/32, 11/32, 12/32, 13/32, 14/32, 15/32, 16/32, Thus, the use of a binary logarithm naturally defines ranges of values of the form]$½^{N+1}$; $½^N$], that all comprise the same number of suitable values. The values of the samples of the transform signal St can therefore be chosen among coefficients in the set of suitable coefficients, with a precision which is roughly proportional to the values of the suitable coefficients themselves, while ensuring that the number of additional bits is as low as possible depending on the values of the suitable coefficients and the number of bits of precision.

Thus, the number of bits of precision NPREC defines the number of suitable values in each range of values on the form]$½^{N+1}$; $½^N$], which is equal to $2^{NPREC}$.

The number of bits of precision can be defined depending on a target precision of the transform. This allows to ensure that each suitable coefficient uses the additional number of bits which is just sufficient to apply the suitable coefficients with the target precision.

It is for example possible to define a target number of suitable values in each range having the form]$½^{N+1}$; $½^N$]. The number of suitable values in such range being equal to $2^{NPREC}$, the number of bits of precision NPREC can be set as the ceiling of a binary logarithm of the target number of suitable values in a range having the form]$½^{N+1}$; $½^N$].

In a number of embodiments of the invention, the number of suitable values in a range having the form]$½^{N+1}$; $½^N$] is equal to 6 divided by an average target step between two suitable values, in dB.

Stated otherwise, it shall be noted that, in embodiments wherein the values of the suitable samples represent changes of amplitude of the input digital signal S1 expressed in dB, the ranges of the form]$½^{N+1}$; $½^N$] have an amplitude of 6 dB. Therefore, a target number of suitable values within the range can be obtained directly by dividing 6 by an average target step between two suitable values, in dB. Thus, this defines the optimal number of bits of precision in order that the set of suitable values achieves a target precision, while retaining an additional number of bits which is as low as possible for each suitable value, and preserving the maximum amount of information from each sample of the input digital signal S1.

This allows a definition of sets of suitable values. For example, the table below defines a set of suitable values corresponding to suitable values comprised between 0 to 4, for an average target step of 0.75 dB between two values and a maximum number of bits of 8.

Based on this information, it can be found that 8 (6/0.75) suitable values are required per range having the form]$½^{N+1}$; $½^N$]. Thus, a number of bits of precision NPREC=log 2(8)=3 is selected.

A set of suitable values such as the set displayed in table 1 below can be defined by setting the suitable values as defined below:
  two raised to the power of the number of bits of precision values, respectively equal to a first integer value from 1 to two raised to the power of the number of bits of precision divided by two raised to the power of the maximum number of bits. In this example, this corresponds to the 16 ($2^4$) values on the bottom of the table, which are correspond to suitable values from $1/2^8$ to $16/2^8$ (that is to say a first integer value from 1 to $2^4$, divided by $2^8$, 8 being the maximum number of bits here;
  for each range in a plurality of ranges defined by a second integer value comprised between a binary logarithm of said maximum suitable value and the maximum number of bits minus one:

two raised to the power of the number of bits of precision minus one values, respectively equal to:

a first integer value from one plus two raised to the power of the number of bits of precision minus one to two raised to the power of the number of bits of precision divided by two raised to the power of the second integer value.

In this example, a maximum suitable value is set to 4. Therefore, it can be obtained using a second integer value equal to log 2(4)+1=2+1=3. Thus, for each second integer value n from 2 to 7 (8–1), 8 ($2^{4-1}$) suitable values are defined, respectively equal to a first integer value comprised between $2^{4-1}+1=9$ to $2^4$ 16, said first integer value being divided by $2^n$, that is to say values from $$\frac{9}{2^n} \text{ to } \frac{16}{2^n},$$

for n=3, . . . , 7. Thus each second integer value n defines a range of value, and the set of suitable values thereby obtained can be expressed in the table below:

TABLE 1

Set of suitable values up to 4 with 3 bits of precision, and a maximum number of bits of 8

| Range | First int value | Second Int value | Suitable values Fraction 1 | Fraction 2 | Decimal | Decibels |
|---|---|---|---|---|---|---|
| 6/12 dB | 16 | 2 | $16/2^2$ | $4/2^0$ | 4.0000 | 12.04 |
| | 15 | 2 | $15/2^2$ | $15/2^2$ | 3.7500 | 11.48 |
| | 14 | 2 | $14/2^2$ | $7/2^1$ | 3.5000 | 10.88 |
| | 13 | 2 | $13/2^2$ | $13/2^2$ | 3.2500 | 10.24 |
| | 12 | 2 | $12/2^2$ | $3/2^0$ | 3.0000 | 9.54 |
| | 11 | 2 | $11/2^2$ | $11/2^2$ | 2.7500 | 8.79 |
| | 10 | 2 | $10/2^2$ | $5/2^1$ | 2.5000 | 7.96 |
| | 9 | 2 | $9/2^2$ | $9/2^2$ | 2.2500 | 7.04 |
| 0/6 dB | 16 | 3 | $16/2^3$ | $2/2^0$ | 2.0000 | 6.02 |
| | 15 | 3 | $15/2^3$ | $15/2^3$ | 1.8750 | 5.46 |
| | 14 | 3 | $14/2^3$ | $7/2^2$ | 1.7500 | 4.86 |
| | 13 | 3 | $13/2^3$ | $13/2^3$ | 1.6250 | 4.22 |
| | 12 | 3 | $12/2^3$ | $3/2^1$ | 1.5000 | 3.52 |
| | 11 | 3 | $11/2^3$ | $11/2^3$ | 1.3750 | 2.77 |
| | 10 | 3 | $10/2^3$ | $5/2^2$ | 1.2500 | 1.94 |
| | 9 | 3 | $9/2^3$ | $9/2^3$ | 1.1250 | 1.02 |
| −6/0 dB | 16 | 4 | $16/2^4$ | $1/2^0$ | 1.0000 | 0.00 |
| | 15 | 4 | $15/2^4$ | $15/2^4$ | 0.9375 | −0.56 |
| | 14 | 4 | $14/2^4$ | $7/2^3$ | 0.8750 | −1.16 |
| | 13 | 4 | $13/2^4$ | $13/2^4$ | 0.8125 | −1.80 |
| | 12 | 4 | $12/2^4$ | $3/2^2$ | 0.7500 | −2.50 |
| | 11 | 4 | $11/2^4$ | $11/2^4$ | 0.6875 | −3.25 |
| | 10 | 4 | $10/2^4$ | $5/2^3$ | 0.6250 | −4.08 |
| | 9 | 4 | $9/2^4$ | $9/2^4$ | 0.5625 | −5.00 |
| −12/−6 dB | 16 | 5 | $16/2^5$ | $1/2^1$ | 0.5000 | −6.02 |
| | 15 | 5 | $15/2^5$ | $15/2^5$ | 0.4688 | −6.58 |
| | 14 | 5 | $14/2^5$ | $7/2^4$ | 0.4375 | −7.18 |
| | 13 | 5 | $13/2^5$ | $13/2^5$ | 0.4063 | −7.82 |
| | 12 | 5 | $12/2^5$ | $3/2^3$ | 0.3750 | −8.52 |
| | 11 | 5 | $11/2^5$ | $11/2^5$ | 0.3438 | −9.28 |
| | 10 | 5 | $10/2^5$ | $5/2^4$ | 0.3125 | −10.10 |
| | 9 | 5 | $9/2^5$ | $9/2^5$ | 0.2813 | −11.02 |
| −18/−12 dB | 16 | 6 | $16/2^6$ | $1/2^2$ | 0.2500 | −12.04 |
| | 15 | 6 | $15/2^6$ | $15/2^6$ | 0.2344 | −12.60 |
| | 14 | 6 | $14/2^6$ | $7/2^5$ | 0.2188 | −13.20 |
| | 13 | 6 | $13/2^6$ | $13/2^6$ | 0.2031 | −13.84 |
| | 12 | 6 | $12/2^6$ | $3/2^4$ | 0.1875 | −14.54 |
| | 11 | 6 | $11/2^6$ | $11/2^6$ | 0.1719 | −15.30 |
| | 10 | 6 | $10/2^6$ | $5/2^5$ | 0.1563 | −16.12 |
| | 9 | 6 | $9/2^6$ | $9/2^6$ | 0.1406 | −17.04 |
| −24/−18 dB | 16 | 7 | $16/2^7$ | $1/2^3$ | 0.1250 | −18.06 |
| | 15 | 7 | $15/2^7$ | $15/2^7$ | 0.1172 | −18.62 |
| | 14 | 7 | $14/2^7$ | $7/2^6$ | 0.1094 | −19.22 |

TABLE 1-continued

Set of suitable values up to 4 with 3 bits of precision, and a maximum number of bits of 8

| Range | First int value | Second Int value | Suitable values Fraction 1 | Fraction 2 | Decimal | Decibels |
|---|---|---|---|---|---|---|
| | 13 | 7 | $13/2^7$ | $13/2^7$ | 0.1016 | −19.87 |
| | 12 | 7 | $12/2^7$ | $3/2^5$ | 0.0938 | −20.56 |
| | 11 | 7 | $11/2^7$ | $11/2^7$ | 0.0859 | −21.32 |
| | 10 | 7 | $10/2^7$ | $5/2^6$ | 0.0781 | −22.14 |
| | 9 | 7 | $9/2^7$ | $9/2^7$ | 0.0703 | −23.06 |
| −30/−24 dB | 16 | 8 | $16/2^8$ | $1/2^4$ | 0.0625 | −24.08 |
| | 15 | 8 | $15/2^8$ | $15/2^8$ | 0.0586 | −24.64 |
| | 14 | 8 | $14/2^8$ | $7/2^7$ | 0.0547 | −25.24 |
| | 13 | 8 | $13/2^8$ | $13/2^8$ | 0.0508 | −25.89 |
| | 12 | 8 | $12/2^8$ | $3/2^6$ | 0.0469 | −26.58 |
| | 11 | 8 | $11/2^8$ | $11/2^8$ | 0.0430 | −27.34 |
| | 10 | 8 | $10/2^8$ | $5/2^7$ | 0.0391 | −28.16 |
| | 9 | 8 | $9/2^8$ | $9/2^8$ | 0.0352 | −29.08 |
| −36/−30 dB | 8 | 8 | $8/2^8$ | $1/2^5$ | 0.0313 | −30.10 |
| | 7 | 8 | $7/2^8$ | $7/2^8$ | 0.0273 | −31.26 |
| | 6 | 8 | $6/2^8$ | $3/2^7$ | 0.0234 | −32.60 |
| | 5 | 8 | $5/2^8$ | $5/2^8$ | 0.0195 | −34.19 |
| −42/−36 dB | 4 | 8 | $4/2^8$ | $1/2^6$ | 0.0156 | −36.12 |
| | 3 | 8 | $3/2^8$ | $3/2^8$ | 0.0117 | −38.62 |
| −48/−42 dB | 2 | 8 | $2/2^8$ | $1/2^7$ | 0.0078 | −42.14 |
| −54/−48 dB | 1 | 8 | $1/2^8$ | $1/2^8$ | 0.0039 | −48.16 |

As displayed in the table above, the set of suitable values defines a full range of suitable values. Each line represents a suitable value, and the columns have the meaning below:

Range: defines range of suitable values. A range is defined for each second integer value, and corresponds to a range of change of amplitude of 6 dB, when the values are expressed in decibels;

First int value: the first integer value k that defines the suitable value;

Second integer value: the second integer value (n) that defines the suitable value;

Suitable values: the 4 columns express each suitable value in 4 different ways:

Fraction 1: represents the suitable value, as a division of the first integer (k) by two raised to the power of the second integer (n);

Fraction 2: represents a simplification of fraction 1, when possible as a fraction of an odd integer number by two raised to the power of an integer number as low as possible. Interestingly, this representation provides a direct indication of the number of additional bits required by the suitable coefficient;

Decimal value: represents each suitable coefficient as a decimal value;

Decibel: represents each suitable coefficient in decibels.

For example, the suitable defined in the range "−6/−12 dB" by the line:

| | | | | | |
|---|---|---|---|---|---|
| 12 | 5 | $12/2^5$ | $3/2^3$ | 0.3750 | −8.521 | has a first number k equal to 12, and a second number n equal to 5. Therefore, this suitable value can be expressed as:

$12/2^5=3/2^3=0.375=-8.52$ dB

This suitable value fulfils all the conditions defined above: it can be expressed as a fraction $\frac{k}{2^n}$, with k=5, n=5;

$n \leq \lceil 3-\log 2(0.375) \rceil = \lceil 3-(-1.41) \rceil = \lceil 4.41 \rceil = 5$, wherein 3 is the number of bits of precision, and 0.375 is the suitable value.

It thus shall be noted that, in the sets of suitable value defined by the invention, not all values are suitable values. For example, in the same range "−6/−12 dB", a value equal to $23/2^6=0.3593$ would not be suitable. Indeed, this fraction cannot be further simplified to be expressed with a division by a lower power of two, and 6 is not a suitable value of the second integer within the range "−6/−12 dB". Indeed, the condition $n \leq \lceil 3-\log 2(0,3593) \rceil$ is not fulfilled, since n=6, and $\lceil 3-\log 2(0,3593) \rceil=5$.

Stated otherwise, the number of additional bits required by a coefficient $23/2^6$ is too high, and it is better to use the coefficients defined in the table 1, that use a lower number of additional bits in the range "−6/−12 dB", and thus reduce the artifacts produced when converting the output digital signal with a limited number of bits of conversion. Therefore, a set of suitable values of the invention provides a set of values that match a required precision at each range of values, while requiring a number of additional bits as low as possible depending on a target precision and range wherein a suitable value is found.

As explained above, the suitable value $12/2^5$ can also be written $3/2_3$. This form is interesting, as it expresses the suitable value as a division of an odd number by two raised to a number as low as possible. This means that the input digital signal can be multiplied by this suitable value by using only 3 additional bits. Even if it is in practic, multiplied the input digital signal is multiplied by $12/2^5$, the information from the input digital signal will be stored in a number of the most significant bits of the output digital signal, which is equal to the number of bits of the input digital signal plus the number of additional bits.

It shall be noted that the table above is written for positive values. However, the invention is not restricted to this case, and it is possible to define negative suitable values using the same principle.

It is also possible to use a higher number of bits of precision, to have more suitable values, even if some of them use more additional bits within each range, or use a lower number of bits of precision to use, even less additional bits within each range, but with a lower number of suitable values and thus less precision.

For example, the table below defines a set of suitable values corresponding to suitable values comprised between 0 to 4, for an average target step of 1.5 dB between two values and a maximum number of bits of 8.

Based on these information, it can be found that a 4 (6/1.5) suitable values are required per range having the form $]½^{N+1}; ½^N]$. Thus a number of bits of precision NPREC=log 2(4)=2 is selected. The suitable values comprised between 0 and 4 are indicated in the table below:

TABLE 2

Set of suitable values up to 4 with 2 bits of precision, and a maximum number of bits of 8

| Range | First int value (k) | Second Int value (n) | Suitable values (k/2$^n$) | | Decimal | Decibels |
|---|---|---|---|---|---|---|
| | | | Fraction 1 | Fraction 2 | | |
| 6/12 dB | 8 | 1 | 8/2$^1$ | 4/2$^0$ | 4.0000 | 12.04 |
| | 7 | 1 | 7/2$^1$ | 7/2$^1$ | 3.5000 | 10.88 |
| | 6 | 1 | 6/2$^1$ | 3/2$^0$ | 3.0000 | 9.54 |
| | 5 | 1 | 5/2$^1$ | 5/2$^1$ | 2.5000 | 7.96 |
| 0/6 dB | 8 | 2 | 8/2$^2$ | 2/2$^0$ | 2.0000 | 6.02 |
| | 7 | 2 | 7/2$^2$ | 7/2$^2$ | 1.7500 | 4.86 |
| | 6 | 2 | 6/2$^2$ | 3/2$^1$ | 1.5000 | 3.52 |
| | 5 | 2 | 5/2$^2$ | 5/2$^2$ | 1.2500 | 1.94 |
| −6 dB/0 dB | 8 | 3 | 8/2$^3$ | 1/2$^0$ | 1.0000 | 0.00 |
| | 7 | 3 | 7/2$^3$ | 7/2$^3$ | 0.8750 | −1.16 |
| | 6 | 3 | 6/2$^3$ | 3/2$^2$ | 0.7500 | −2.50 |
| | 5 | 3 | 5/2$^3$ | 5/2$^3$ | 0.6250 | −4.08 |
| −12/−6 dB | 8 | 4 | 8/2$^4$ | 1/2$^1$ | 0.5000 | −6.02 |
| | 7 | 4 | 7/2$^4$ | 7/2$^4$ | 0.4375 | −7.18 |
| | 6 | 4 | 6/2$^4$ | 3/2$^3$ | 0.3750 | −8.52 |
| | 5 | 4 | 5/2$^4$ | 5/2$^4$ | 0.3125 | −10.10 |
| −18/−12 dB | 8 | 5 | 8/2$^5$ | 1/2$^2$ | 0.2500 | −12.04 |
| | 7 | 5 | 7/2$^5$ | 7/2$^5$ | 0.2188 | −13.20 |
| | 6 | 5 | 6/2$^5$ | 3/2$^4$ | 0.1875 | −14.54 |
| | 5 | 5 | 5/2$^5$ | 5/2$^5$ | 0.1563 | −16.12 |
| −24/−18 dB | 8 | 6 | 8/2$^6$ | 1/2$^3$ | 0.1250 | −18.06 |
| | 7 | 6 | 7/2$^6$ | 7/2$^6$ | 0.1094 | −19.22 |
| | 6 | 6 | 6/2$^6$ | 3/2$^5$ | 0.0938 | −20.56 |
| | 5 | 6 | 5/2$^6$ | 5/2$^6$ | 0.0781 | −22.14 |
| −30/−24 dB | 8 | 7 | 8/2$^7$ | 1/2$^4$ | 0.0625 | −24.08 |
| | 7 | 7 | 7/2$^7$ | 7/2$^7$ | 0.0547 | −25.24 |
| | 6 | 7 | 6/2$^7$ | 3/2$^6$ | 0.0469 | −26.58 |
| | 5 | 7 | 5/2$^7$ | 5/2$^7$ | 0.0391 | −28.16 |
| −36/−30 dB | 8 | 8 | 8/2$^8$ | 1/2$^5$ | 0.0313 | −30.10 |
| | 7 | 8 | 7/2$^8$ | 7/2$^8$ | 0.0273 | −31.26 |
| | 6 | 8 | 6/2$^8$ | 3/2$^7$ | 0.0234 | −32.60 |
| | 5 | 8 | 5/2$^8$ | 5/2$^8$ | 0.0195 | −34.19 |
| −42/−36 dB | 4 | 8 | 4/2$^8$ | 1/2$^6$ | 0.0156 | −36.12 |
| | 3 | 8 | 3/2$^8$ | 3/2$^8$ | 0.0117 | −38.62 |
| −48/−42 dB | 2 | 8 | 2/2$^8$ | 1/2$^7$ | 0.0078 | −42.14 |
| −54/−48 dB | 1 | 8 | 1/2$^8$ | 1/2$^8$ | 0.0039 | −48.16 |

It can be noted that the maximum number of bits, set to 8 in the above examples, limits the attenuation that can be reached by the suitable values. Indeed, the lowest suitable value is here $½^8$, which corresponds to an attenuation about 48 dB. However, the invention is not restricted to this example, and different maximum numbers of bits may be used. For example, the table below corresponds to a set of suitable values yup to 4 with 2 bits of precision. By contrast with table 2, the maximum number of bits is set to 9:

TABLE 3

Set of suitable values up to 4 with 2 bits of precision, and a maximum number of bits of 9

| Range | First int value (k) | Second Int value (n) | Suitable values (k/2$^n$) | | Decimal | Decibels |
|---|---|---|---|---|---|---|
| | | | Fraction 1 | Fraction 2 | | |
| 6/12 dB | 8 | 1 | 8/2$^1$ | 4/2$^0$ | 4.0000 | 12.04 |
| | 7 | 1 | 7/2$^1$ | 7/2$^1$ | 3.5000 | 10.88 |
| | 6 | 1 | 6/2$^1$ | 3/2$^0$ | 3.0000 | 9.54 |
| | 5 | 1 | 5/2$^1$ | 5/2$^1$ | 2.5000 | 7.96 |
| 0/6 dB | 8 | 2 | 8/2$^2$ | 2/2$^0$ | 2.0000 | 6.02 |
| | 7 | 2 | 7/2$^2$ | 7/2$^2$ | 1.7500 | 4.86 |
| | 6 | 2 | 6/2$^2$ | 3/2$^1$ | 1.5000 | 3.52 |
| | 5 | 2 | 5/2$^2$ | 5/2$^2$ | 1.2500 | 1.94 |
| −6 dB/0 dB | 8 | 3 | 8/2$^3$ | 1/2$^0$ | 1.0000 | 0.00 |
| | 7 | 3 | 7/2$^3$ | 7/2$^3$ | 0.8750 | −1.16 |
| | 6 | 3 | 6/2$^3$ | 3/2$^2$ | 0.7500 | −2.50 |
| | 5 | 3 | 5/2$^3$ | 5/2$^3$ | 0.6250 | −4.08 |

TABLE 3-continued

Set of suitable values up to 4 with 2 bits of precision, and a maximum number of bits of 9

| Range | First int value (k) | Second Int value (n) | Suitable values (k/2$^n$) Fraction 1 | Fraction 2 | Decimal | Decibels |
|---|---|---|---|---|---|---|
| −12/−6 dB | 8 | 4 | 8/2$^4$ | 1/2$^1$ | 0.5000 | −6.02 |
|  | 7 | 4 | 7/2$^4$ | 7/2$^4$ | 0.4375 | −7.18 |
|  | 6 | 4 | 6/2$^4$ | 3/2$^3$ | 0.3750 | −8.52 |
|  | 5 | 4 | 5/2$^4$ | 5/2$^4$ | 0.3125 | −10.10 |
| −18/−12 dB | 8 | 5 | 8/2$^5$ | 1/2$^2$ | 0.2500 | −12.04 |
|  | 7 | 5 | 7/2$^5$ | 7/2$^5$ | 0.2188 | −13.20 |
|  | 6 | 5 | 6/2$^5$ | 3/2$^4$ | 0.1875 | −14.54 |
|  | 5 | 5 | 5/2$^5$ | 5/2$^5$ | 0.1563 | −16.12 |
| −24/−18 dB | 8 | 6 | 8/2$^6$ | 1/2$^3$ | 0.1250 | −18.06 |
|  | 7 | 6 | 7/2$^6$ | 7/2$^6$ | 0.1094 | −19.22 |
|  | 6 | 6 | 6/2$^6$ | 3/2$^5$ | 0.0938 | −20.56 |
|  | 5 | 6 | 5/2$^6$ | 5/2$^6$ | 0.0781 | −22.14 |
| −30/−24 dB | 8 | 7 | 8/2$^7$ | 1/2$^4$ | 0.0625 | −24.08 |
|  | 7 | 7 | 7/2$^7$ | 7/2$^7$ | 0.0547 | −25.24 |
|  | 6 | 7 | 6/2$^7$ | 3/2$^6$ | 0.0469 | −26.58 |
|  | 5 | 7 | 5/2$^7$ | 5/2$^7$ | 0.0391 | −28.16 |
| −36/−30 dB | 8 | 8 | 8/2$^8$ | 1/2$^5$ | 0.0313 | −30.10 |
|  | 7 | 8 | 7/2$^8$ | 7/2$^8$ | 0.0273 | −31.26 |
|  | 6 | 8 | 6/2$^8$ | 3/2$^7$ | 0.0234 | −32.60 |
|  | 5 | 8 | 5/2$^8$ | 5/2$^8$ | 0.0195 | −34.19 |
| −42/−36 dB | 8 | 9 | 8/2$^9$ | 1/2$^6$ | 0.0156 | −36.12 |
|  | 7 | 9 | 7/2$^9$ | 7/2$^9$ | 0.0137 | −37.28 |
|  | 6 | 9 | 6/2$^9$ | 3/2$^8$ | 0.0117 | −38.62 |
|  | 5 | 9 | 5/2$^9$ | 5/2$^9$ | 0.0098 | −40.21 |
| −48/−42 dB | 4 | 9 | 4/2$^9$ | 1/2$^7$ | 0.0078 | −42.14 |
|  | 3 | 9 | 3/2$^9$ | 3/2$^9$ | 0.0059 | −44.64 |
| −54/−48 dB | 2 | 9 | 2/2$^9$ | 1/2$^8$ | 0.0039 | −48.16 |
| −60/−54 dB | 1 | 9 | 1/2$^9$ | 1/2$^9$ | 0.0020 | −54.19 |

The set of table 3 thus comprises, in addition of the suitable coefficients already found in table 2, coefficients that can be written in the form $$\frac{k}{2^n},$$

with n=9. Thus, the set defined in table 3 defines coefficients down to 1/2$^9$, that correspond to an attenuation of a signal down to around −54 dB.

It can also be noted that, in the set of suitable values defined in table 2, in each sub-range, the suitable values use a lower number of additional bits. For example, in the range "−6/−12 dB":

in the set defined in table 1, the second integer value is equal to 5, which means that each suitable value can be written in the form $$\frac{k}{2^n},$$

with n≤5;

in the set defined in tables 2 and 3, the second integer value is equal to 4, which means that each suitable value can be written in the form $$\frac{k}{2^n},$$

with n≤4.

Therefore, using the suitable values in the sets defined in the tables 2 and 3 ensures that a maximum additional number of bits of 4 will be used for suitable values ranging from −12 dB to −6 dB (i.e between ¼ and ½), while using values in the set defined in table 1 ensures that a maximum additional number of bits of 5 will be used for suitable values in the same range from −12 dB to −6 dB (i.e between ¼ and ½). However, the set defined in table 1 contains a higher number of suitable values, and therefore allows a selection of a suitable value with more precision.

These examples highlight the ability of the invention to obtain the best compromise between reducing the number of additional bits required to preserve the information from the input digital signal, thereby avoiding degradation upon future conversion of the output digital signal, and obtaining suitable values with a desired precision. It shall be noted that the invention is not restricted to these examples, and lower or higher numbers of bits of precision can be used, in order to obtain suitable values with an increased precision, or lower the number of additional bits required by the suitable values.

It is also possible to use sets of suitable value that use a subset of one of the sets defined above. For example, one may wish to build a set of suitable values with a number of bits of precision equal to 3, a maximum number of bits equal to 8, and an average step of 1 dB between two values. This is possible by selecting a subset of the values in table 1, corresponding to suitable values with steps of about 1 dB between successive suitable values.

In a number of embodiments of the invention, wherein the transform signal comprises a plurality of samples, the samples of the transform signal can have values that belong to different sets of suitable values. For example, each sample can be associated to a number of bits of precision, and the value of the sample can be selected among suitable values defined at least by the number of bits of precision associated to this sample.

Therefore, the set of suitable values which is best suited for each sample can be used, to be tailored to a required precision of each sample. These embodiments are interesting for transform signals that are representative of a transformation wherein the value certain samples need to be applied very precisely. For example, as will be exemplified in FIGS. 11a to 11c, a RIAA filter can be built using the invention, by providing more precision (i.e using suitable values defined using a high number of bits of precision) to the values of samples that have a steep variation from sample to sample, and less precision to values of other samples, in order to limit the number of bits of these samples. This allows preserving the overall shape of the curve, while limiting as much as possible the number of additional bits used.

In a number of embodiments of the invention, the transform signal St is defined to apply a transform on the input digital signal S1. For example, the convolution of the input digital signal by a transform signal having a single sample changes the amplitude of the input digital signal, while the convolution of the input digital signal by a transform signal having a plurality of samples allows the application of a FIR filter whose impulse response is defined by the transform signal St.

As explained above, in order to prevent as much as possible a loss of information from the input digital signal S1 in a future conversion of the output digital signal S2, the values of the samples of the transform signal St belong to one or more sets of suitable values.

For example, each sample of the transform signal St may be associated with a precision, in dB. It is thus possible to define, for each sample of the transform signal St, a set of suitable value as explained above.

A set of possible values as defined by the invention may not allow to reach all possible target values for a sample. For example, if the device 200a is configured to apply a change of amplitude to the input digital signal S1 by performing a convolution with a transform signal having a single sample representative of a coefficient of change of amplitude having the suitable values defined in the table 1, the device 200a will not be able to apply a coefficient of change of amplitude of −25.00 dB. Instead, it may be configured to use a nearby suitable value, such as the value $14/2^8$, that corresponds to a coefficient of change of amplitude of −25.24 dB. The same principle can be applied if the samples of the transform signal St correspond to coefficients of a FIR filter.

In a number of embodiments of the invention, the values of the one or more samples are selected among the suitable values according to target values and a rule of selection of suitable values. This allows a selection of the values of the one or more samples which is the most appropriate depending on target values of the samples of the transform signal.

In a number of embodiments of the invention, the rule of selection of values selects suitable values which are the closest to the target values. This allows the transform signal to be formed of suitable values, and therefore reducing the degradations of the signal, while remaining as close as possible to the target values.

This rule also allows, based on a number of bits of precision NPREC and a maximum number of bits NMAX, a direct determination of a suitable value $V_s$ corresponding to a target value $V_t$, by applying the steps below:

determination of the second integer value n for the suitable value $V_s$:

$n = \min(\text{NPREC} - \log 2(|V_t|, \text{NMAX})$;

determination of a first integer value k for the suitable value $V_s$:

$k = \text{round}(\max(V_t * 2^n; 1)$ if $V_t > 0$;

$k = \text{round}(\min(V_t * 2^n; -1)$ if $V_t < 0$;

Calculation of $V_s$ based on n and k:

$$V_s = \frac{k}{2^n}$$

Such rule of calculation advantageously allows to calculate a closest suitable value for a target value, without needing to compute the full set of suitable value. The table below provides some examples of calculations of suitable values for a plurality of target values, either formulated as a target coefficient in dB, or a target decimal value.

The table below provides an example of calculation of suitable values according to target values, for a number of bits of precision of 3, and a maximum number of bits of 8.

TABLE 4

| Examples of calculations of suitable values, for NPREC = 3 and NMAX = 8 | | | | | | | | | |
|---|---|---|---|---|---|---|---|---|---|
| Tgt Val (dB) | Tgt val (dec.) | n | Target k | k | Suit. Val. | Suit. Val. (dB) | Error | Error (%) | Error (dB) |
| −3 | 0.7079458 | 4 | 11.327133 | 11 | 0.6875 | −3.2545 | −0.0204 | −2.9% | −0.2545 |
| 6 | 1.9952623 | 3 | 15.962099 | 16 | 2.0000 | 6.0206 | 0.0047 | 0.2% | 0.0206 |
| 1 | 1.1220185 | 3 | 8.9761476 | 9 | 1.1250 | 1.0231 | 0.0030 | 0.3% | 0.0231 |
| −6 | 0.5011872 | 4 | 8.0189957 | 8 | 0.5000 | −6.0206 | −0.0012 | −0.2% | −0.0206 |
| −9 | 0.3548134 | 5 | 11.354028 | 11 | 0.3438 | −9.2751 | −0.0111 | −3.1% | −0.2751 |
| −10 | 0.3162278 | 5 | 10.119289 | 10 | 0.3125 | −10.1030 | −0.0037 | −1.2% | −0.1030 |
| −11 | 0.2818383 | 5 | 9.0188254 | 9 | 0.2813 | −11.0181 | −0.0006 | −0.2% | −0.0181 |
| −12 | 0.2511886 | 5 | 8.0380366 | 8 | 0.2500 | −12.0412 | −0.0012 | −0.5% | −0.0412 |
| −42 | 0.0079433 | 8 | 2.0334803 | 2 | 0.0078 | −42.1442 | −0.0001 | −1.6% | −0.1442 |
| −44 | 0.0063096 | 8 | 1.6152508 | 2 | 0.0078 | −42.1442 | 0.0015 | 23.8% | 1.8558 |
| −60 | 0.001 | 8 | 0.256 | 1 | 0.0039 | −48.1648 | 0.0029 | 290.6% | 11.8352 |
| −3.75 | 0.6494 | 4 | 10.3904 | 10 | 0.6250 | −4.0824 | −0.0244 | −3.8% | −0.3324 |
|  | −0.47 | 5 | −15.04 | −15 | −0.4688 | −6.5812 | 0.0012 | −0.3% |  |
|  | −0.6494 | 4 | −10.3904 | −10 | −0.6250 | −4.0824 | 0.0244 | −3.8% |  |
|  | 0.33 | 5 | 10.56 | 11 | 0.3438 | −9.2751 | 0.0138 | 4.2% |  |
|  | 0.56 | 4 | 8.96 | 9 | 0.5625 | −4.9975 | 0.0025 | 0.4% |  |
|  | 0.5 | 4 | 8 | 8 | 0.5000 | −6.0206 | 0.0000 | 0.0% |  |
|  | 0.47 | 5 | 15.04 | 15 | 0.4688 | −6.5812 | −0.0012 | −0.3% |  |
|  | 0.33 | 5 | 10.56 | 11 | 0.3438 | −9.2751 | 0.0138 | 4.2% |  |
|  | 0.25 | 5 | 8 | 8 | 0.2500 | −12.0412 | 0.0000 | 0.0% |  |
|  | 0.15 | 6 | 9.6 | 10 | 0.1563 | −16.1236 | 0.0063 | 4.2% |  |
|  | 0.125 | 6 | 8 | 8 | 0.1250 | −18.0618 | 0.0000 | 0.0% |  |
|  | 0.111 | 7 | 14.208 | 14 | 0.1094 | −19.2216 | −0.0016 | −1.5% |  |
|  | 0.0007 | 8 | 0.1792 | 1 | 0.0039 | −48.1648 | 0.0032 | 458.0% |  |
|  | 0.0000089 | 8 | 0.0022784 | 1 | 0.0039 | −48.1648 | 0.0039 | 43790.4% |  |

For example, using this rule, if a coefficient of change of amplitude needs to be selected in the suitable values of Table 1:

if the target coefficient of amplitude change is −2 dB, the suitable value $13/2^4$, that corresponds to an amplitude change of −1.80 dB which is the closest to −2 dB in table 1 is selected;

if the target coefficient of amplitude change is −7 dB, the suitable value $15/2^5$, that corresponds to an amplitude change of −7.18 dB which is the closest to −7 dB in table 1 is selected.

Although not represented here, the values have been calculated using an Excel file, columns and row thereof being numbered as follows:

the row start from 1, which is the title row. The row starting with "Tgt Val" is row 1, the row starting with "−3" is row to, the row starting with "6" is row 3 etc. . . .

the columns start from B. Thus the columns titled "Tgt Val (dB)" is column B, the column titles "Tgt Val (dec.)" column C, the column titled "n" column D, etc. . . .

the example the number of bits of precision is stored as a parameter in the cell N8, and the maximum number of bits as a parameter in cell N9, which are not represented here. IN this example the number of bits of precision is equal to 3, and the maximum number of bits equal to 8.

The formulas used in Excel will be reminded afterwards, using the column/cell numbering defined above.

The values in the Table 3 have been calculated or entered in the program the steps below, expressed by means of example for line 2:

Tgt val. (dB): column B: input target value, expressed in dB;

Tgt val (dec.): column C: input target value, expressed in decimal value:
  in line 2, calculated using the formula "=POW(10;B2/20)" that corresponds to a conversion of the target value from dB to decimal values;
  starting from line 18, the target values are entered directly in decimal value;

n: column D: second integer value n for the suitable value, calculated using the formula: "MIN(PLAFOND($N$8−LOG(ABS(C2);2);1);$N$9)", which means that the second integer value n for the suitable value is equal to the number of bits of precision NPREC minus the binary logarithm of the target value, unless this value is below the maximum number of bits. As noted above, the second integer value can be equal to the number of additional bits if the first integer value is an odd value, or grater that the additional number of bits, if the first integer value is an even value and the fraction can be simplifier;

Target k: column E: the non-integer value k' that would correspond to the target value, expressed in the form $$\frac{k'}{2^n},$$

calculated using the formula "=C2*POW(2;D2);

k: column F: first integer value k of the suitable coefficient, corresponding to a rounding of the non-integer value k', calculated using the formula: =SIGN(E2)*MAX(ABS(ROUND(E2;0)); 1);

Suit val.: column G: suitable value, expressed as a decimal value, calculated as $k/2^n$, using the formula: "=F2/POW(2;D2)";

Suit. val. (dB): column H: suitable value, expressed in dB, calculated using the formula: "=20*LOG(ABS(G2); 10)";

Error: column I: error between the suitable value and the target value, in decimal value, calculated using the formula "=G2−C2";

Error (%): column J: error between the suitable value and the target value, in percentage of the target value, calculated using the formula "=I2/C2";

Error (dB): column K: error between the suitable value and the target value, in dB, calculated using the formula: "=H2−B2", for target values initially expressed in dB.

Table 4 demonstrates the ability of the invention to calculate directly a suitable value based on a target value. The table also demonstrates that the error between the target coefficient and the suitable coefficient remains low in percentage of the target value or in dB. The only exception concerns very low target values such as −60 dB that cannot be expressed using the maximum number of bits. In this case, as demonstrated by Table 1, a maximum number of bits of 8 does not allow suitable coefficients below −48,1648 dB.

However, if needed, these errors can be reduced using a higher number of bits of precision and/or a higher maximum number of bits. The table below displays the calculation of suitable values for the same target coefficients, using 5 bits of precision (NPREC=5), and a maximum number of bits of 24 (NMAX=24):

TABLE 5

Examples of calculations of suitable values, for NPREC = 5 and NMAX = 24

| Tgt Val (dB) | Tgt val (dec.) | n | Target k | k | Suit. Val. | Suit. Val. (dB) | Error | Error (%) | Error (dB) |
|---|---|---|---|---|---|---|---|---|---|
| −3 | 0.7079458 | 6 | 45.30853 | 45 | 0.7031 | −3.0593 | −0.0048 | −0.7% | −0.0593 |
| 6 | 1.9952623 | 5 | 63.848394 | 64 | 2.0000 | 6.0206 | 0.0047 | 0.2% | 0.0206 |
| 1 | 1.1220185 | 5 | 35.904591 | 36 | 1.1250 | 1.0231 | 0.0030 | 0.3% | 0.0231 |
| −6 | 0.5011872 | 6 | 32.075983 | 32 | 0.5000 | −6.0206 | −0.0012 | −0.2% | −0.0206 |
| −9 | 0.3548134 | 7 | 45.416114 | 45 | 0.3516 | −9.0799 | −0.0033 | −0.9% | −0.0799 |
| −10 | 0.3162278 | 7 | 40.477154 | 40 | 0.3125 | −10.1030 | −0.0037 | −1.2% | −0.1030 |
| −11 | 0.2818383 | 7 | 36.075302 | 36 | 0.2813 | −11.0181 | −0.0006 | −0.2% | −0.0181 |
| −12 | 0.2511886 | 7 | 32.152146 | 32 | 0.2500 | −12.0412 | −0.0012 | −0.5% | −0.0412 |
| −42 | 0.0079433 | 12 | 32.535684 | 33 | 0.0081 | −41.8769 | 0.0001 | 1.4% | 0.1231 |
| −44 | 0.0063096 | 13 | 51.688026 | 52 | 0.0063 | −43.9477 | 0.0000 | 0.6% | 0.0523 |
| −60 | 0.001 | 15 | 32.768 | 33 | 0.0010 | −59.9387 | 0.0000 | 0.7% | 0.0613 |
| −3.75 | 0.6494 | 6 | 41.5616 | 42 | 0.6563 | −3.6586 | 0.0069 | 1.1% | 0.0914 |
| | −0.47 | 7 | −60.16 | −60 | −0.4688 | −6.5812 | 0.0012 | −0.3% | |
| | −0.6494 | 6 | −41.5616 | −42 | −0.6563 | −3.6586 | −0.0069 | 1.1% | |
| | 0.33 | 7 | 42.24 | 42 | 0.3281 | −9.6792 | −0.0019 | −0.6% | |
| | 0.56 | 6 | 35.84 | 36 | 0.5625 | −4.9975 | 0.0025 | 0.4% | |
| | 0.5 | 6 | 32 | 32 | 0.5000 | −6.0206 | 0.0000 | 0.0% | |
| | 0.47 | 7 | 60.16 | 60 | 0.4688 | −6.5812 | −0.0012 | −0.3% | |
| | 0.33 | 7 | 42.24 | 42 | 0.3281 | −9.6792 | −0.0019 | −0.6% | |
| | 0.25 | 7 | 32 | 32 | 0.2500 | −12.0412 | 0.0000 | 0.0% | |
| | 0.15 | 8 | 38.4 | 38 | 0.1484 | −16.5691 | −0.0016 | −1.0% | |
| | 0.125 | 8 | 32 | 32 | 0.1250 | −18.0618 | 0.0000 | 0.0% | |
| | 0.111 | 9 | 56.832 | 57 | 0.1113 | −19.0679 | 0.0003 | 0.3% | |
| | 0.0007 | 16 | 45.8752 | 46 | 0.0007 | −63.0744 | 0.0000 | 0.3% | |
| | 0.0000089 | 22 | 37.329306 | 37 | 0.0000 | −101.0892 | 0.0000 | −0.9% | |

This example shows that the additional bits allow a definition of suitable coefficients which are closer to the target coefficients. However, the use of higher additional numbers of bits may cause loss of information from the input digital signal, and the degradations upon conversion of the output digital signal. The number of bits of precision NPREC, and maximum number of bits NMAX can be set according to the needs of a user of the device 200a. Therefore, these examples demonstrate the ability of the invention to perform a compromise between a reduction of the loss of information in the output signal, and precision of the transformation according to the needs of a user.

The examples above represent rules of selection of a suitable value which is the closest from a target value in a set of suitable values. However, other rules of selection of suitable values are possible. For example, a rule of selection may be based on a combination of an error between target and suitable values, and an additional number of bits required by suitable values. Such rule of selection select, starting from a target value, a suitable value which is close to the target value, and, if possible use a low number of additional bits. By means of example, coming back to Table 1, if a suitable value needs to be selected in table 1 for a corresponding target value of −9 dB, the two closest suitable values are:

a. $12/2^5 = 3/2^3 = -8.52$ dB
b. $11/2^5 = -9.28$ dB

As noted above, the additional number of bits required by a suitable value is read when the suitable value is expressed in the form $$\frac{k}{2^n},$$

k being an odd value Although the suitable value b. is closest to the target value, the suitable value a. uses only 3 additional bits, while the suitable value b. uses 5. It may therefore be desirable to use the suitable value a. instead of b. According to various embodiments of the invention, a number of rules are possible to select a combination of an error between the suitable and target values, and a number of additional bits required by suitable values. For example:

two suitable values, above and below the target value can be selected (in this example, a. and b.);
if the number of additional bits required by each suitable value are both below the difference between the bit depth of the input digital signal and a conversion accuracy (i.e., whatever the suitable value selected, all information from the input digital signal will be reserved), the suitable value which is the closest to the target value is selected;
otherwise, the suitable value which has the lowest number of additional bits is selected, in order to preserve as much information from the input digital signal as possible during the conversion;
a weighted score may be computed for each suitable value, based on the additional number of bits required by the suitable value, and the closeness to the target value. The suitable value which has the highest score is selected.

The suitable value can also be selected as the suitable value that uses a number of additional bits as low a possible within an error range around the target value. For example, if a suitable value is to be selected in table for −8.5±0.5 dB, a suitable value may be selected in the range [−7.5; −9.5 dB]. Three candidate suitable values are found within this range:

a. $13/2^5 = -7.82$ dB, which requires 5 additional bits;
b. $12/2^5 = 3/2^3 = -8.52$ dB, which requires 3 additional bits;
c. $11/2^5 = -9.28$ dB, which requires 5 additional bits.

Thus, the value b., which is the value which requires the lowest number of additional bits within the error range, is selected.

Another option consists in first selecting the suitable value which is the closest to the target value, then checking if a nearby value allows a further reduction of the number of additional bits, and selecting such value if a further reduction of the number of bits is available. For example, in the range]−6 dB; 0 dB] of Table 1:

if the suitable value $12/2^4 = 3/2^2$, which thus requires 2 additional bits, is initially selected, none of the nearby suitable values $11/2^4$, $13/2^4$, which cannot be simplified and thus require 4 additional bits, allow a further reduction of the number of additional bits. Therefore the suitable value $12/2^4$ remains selected;
on the contrary, if the suitable value $11/2^4$, which requires 4 additional bits, is initially selected, two nearby values $10/2^4 = 5/2_3$, and $12/2^4 = 3/2^2$ respectively use 3 and 2 additional bits, and therefore allow using respectively 1 and 2 fewer additional bits. Therefore, the suitable value $12/2^4$ can be selected, which remain close to the suitable value $11/2^4$ initially selected, and thus to the target value, while further reducing the number of additional bits used.

More generally, when a suitable value having the form $$\frac{k}{2^n},$$

with k being an odd value is initially selected, it can be replaced by a nearby value in the set that allows a reduction of the number of bits of precision of at least two.

Such solution of reduction of the number of bits by the use of nearby values can also be used iteratively to select a suitable value that uses a number of additional bits as low as possible within an error range around a target value. For example, a first candidate suitable value $$\frac{k}{2^n}$$

can be selected. Then, if k is an even number, the fraction can be simplified up to a fraction $$\frac{k_1}{2^{n_1}},$$

with $k_1$ odd. The two neighboring values $$\frac{k+1}{2^n} \text{ and } \frac{k-1}{2^n}, \text{ or } \frac{k_1-1}{2^{n_1}} \text{ and } \frac{k_1+1}{2^{n_1}}$$

are selected. Each value that is within the error range is selected as a candidate value. Each of these values has an even numerator, and thus can be simplified down to a fraction of a lesser power of two. Therefore, each of these values requires a lower number of bit. For each selected candidate value, the corresponding fraction is simplified to be expressed as a fraction with an odd numerator. For example, if k=5, n=8, and the neighboring value $$\frac{k+1}{2^n} = \frac{5+1}{2^8} = \frac{6}{2^8} = \frac{3}{2^7}$$

is selected, the fraction is simplified to $$\frac{k'}{2^{n'}} = \frac{3}{2^7}$$

in order to have an odd numerator. Then two new candidates $$\frac{k'+1}{2^{n'}} = \frac{4}{2^7} \text{ and } \frac{k'-1}{2^{n'}} = \frac{2}{2^7}$$

are selected, which require at least one fewer additional bits. If at least one of these values is within the error range, the process continues until the best suitable values, that uses the minimum number of additional bits and is within the error range, is selected.

In a number of embodiments of the invention, the device 200a is configured to change the amplitude of the input digital signal S1. To do so, the transform signal comprises a single value, which is representative of a coefficient of amplitude change to be applied to the signal. Therefore, at the output of the convolution of the input digital signal S1 and the transform signal St, the output digital signal has been amplified or attenuated compared to the input digital signal.

If the coefficient of amplitude change is representative of an attenuation, this can be performed without risk of saturating the signal. On the contrary, if the coefficient of amplitude change is representative of an amplification, there is a risk that the output digital signal is saturated. In order to prevent, or at least limit, a saturation of the signal, the processing logic is configured to use a maximum coefficient of saturation, that correspond to a maximum allowed saturation for a sample of the signal. If the coefficient is equal to 1, the signal shall not be saturated at all, for successive time windows of the input digital signal, to:
  determine a maximum absolute value of said input digital signal on a time window;
  calculate a maximum coefficient of amplitude change based on said maximum absolute value and a predefined maximum coefficient of saturation. For example, if the maximum absolute value of the input digital signal over the time window corresponds to an intensity of 0.8, and a maximum coefficient of saturation of 1.2 is selected, the maximum coefficient of amplitude change is equal to 1.2/0.8=1.5. Therefore, this maximum coefficient of amplitude change takes into account both the fact that the input digital signal does not reach the maximum values in the time window, and that an amount of saturation of 20% is allowed;
  select the value of said single sample in said set of suitable values which is representative of a coefficient of amplitude change below said maximum coefficient of amplitude change which is the closest to a target coefficient of amplitude change. This means that, the target coefficient of amplitude change is below the maximum threshold of amplitude change, the closest suitable value will be selected. Otherwise, the suitable value corresponding to an amplitude change just below the maximum will be selected.

This allows, in the same time, to use a suitable coefficient of the invention to prevent degradations when converting the digital output signal, and prevent an excessive saturation of the output signal.

These examples are provided by means of example only, and any rule that allow a selection of a suitable value based on a distance with a target value, and an additional number of bits required by the suitable value can be used.

The processing logic 220a can perform the convolution between the input digital signal and the transform digital signal, in order to obtain the output digital signal, in a number of different ways.

For example, the values of samples of the transform signal St can be stored as integer values, and the processing logic can be configured to perform a full scale conversion of the samples of the input digital signal in the output bit depth $n_2$, and multiply the converted sample by one or more samples of the digital signal representative of the transform.

It is also possible to store the values of the transform signal as integer values equal to the value of the suitable coefficients multiplied by two raised to a power of the difference between said output bit depth and said input bit depth. Thus, the convolution of the input digital signal by the transform digital signal can be performed by first converting samples of the input digital signal into converted samples having the output bit depth, but integer values identical to the values of the input digital signal, then multiplying the converted values by the integer values of the transform signal.

The FIG. 2b represents a second example of a device in a number of embodiments of the invention.

As the device 200a, the device 200b comprises a processing logic 210b configured to perform a convolution of a first digital signal S1 and a transform digital signal St in order to obtain an output digital signal S2, to be converted into output analog signal S2' by a DAC 220b.

In the example of FIG. 2b, the DAC 220b is represented inside the device 200b. However, this example is not limitative, and the DAC may be located in a further device in connection with the device 200b. The DAC 220b may also be replaced by a digital converter that converts the digital output signal to a further digital output signal.

The device 200b is in connection with one or more attenuators or amplifiers 230b, 231b . . . that are configured to apply a fixed gain to the output analog signal. Similarly to the DAC 220b, the one or more attenuators or amplifiers 230b, 231b are represented in the device 200b in figure b, but may also be located in a further device in connection to the device 200b.

Each amplifier or attenuator is characterized by a fixed gain. For example, the attenuator 230b has a gain G1 to attenuate the output analog signal into an attenuated analog signal S2", and the amplifier 231b is configured has a gain G2 to amplify the output analog signal into an amplified analog signal S2'". These examples are not limitative, and one or more amplifiers, one or more attenuators with any possible gain can be used. As a variant, one or more analog amplifiers or attenuators with a variable gain may be used.

As in the device 200a, the transform signal St for the device 200b is formed of suitable coefficients. All embodiments discussed with reference to FIG. 2a are applicable to the device 200b. In addition, these suitable coefficients can be combined with the fixed gains G1, G2 . . . of the one or more amplifiers or attenuators 230b, 231b . . . in order to increase the number of coefficients that can be applied to the input digital signal S1.

For example, if the transform signal St is formed of a single suitable value described in Table 1 to attenuate the input digital signal S1, and the attenuator 230b has a gain of −12 dB, the suitable coefficients can be combined with the coefficient G1. For example, using a suitable coefficient $1/2^8 = -48.16$ dB in combination with the gain G1=−12 dB allows applying an overall gain of −60.16 dB.

It is also possible to use an attenuator with fixed or variable gain to lower the number of additional bits required by the suitable values. For example, a global attenuation around −20 dB could be obtain either by using the coefficient $13/2^7 = -19.87$ dB, which requires 7 additional bits, or a combination of the coefficient $13/2^5 = -7.87$ dB, which requires only 5 additional bits addition to the gain G1=−12 dB of the attenuator 230b.

However, it shall be noted that analog attenuators or amplifiers can also introduce degradations of the output signal. Moreover, the implementation of a high quality analog amplitude change with variable gain is very costly. In order to mitigate these degradations, fixed gains, or a limited number of variable gains may be used. However, the multiplication of such amplifiers or attenuators may be costly. Therefore, the device 200b, by combining the suitable coefficients of the invention with a limited number of amplifiers or attenuators that have either a fixed gain, or a limited number of variable gains, provides an efficient solution to transform the input digital signal with the best possible output quality and a reasonable cost.

The FIG. 2c represents a third example of a device in a number of embodiments of the invention.

As the device 200a and 200b, the device 200c comprises a processing logic 210c configured to perform a convolution of a first digital signal S1 and a transform digital signal St in order to obtain an output digital signal S2, to be converted into output analog signal S2' by a DAC 220c.

In a number of embodiments of the invention, the transform digital signal St is predefined in order to apply a static filter to the first digital signal S1. In other embodiments of the invention, the transform digital signal St is updated upon the occurrence of events. It is for example the case if the transform signal St implements a change of volume, that is modified upon an input of the user. The transform signal St can also be modified in real time. It is for example the case for audio prosthesis applications, wherein the transform signal St is used to perform noise removal based on a capture of external noise in real time.

In some cases, the problem of the loss of information during the conversion of the output digital signal S2 applies to the transform digital signal rather than the input digital signal.

It is for example the case for an audio prosthesis application, in which the transform signal St corresponds to a transform for removing ambient noise, which is updated in real time based on a capture of ambient noise, while the input digital signal S1 is the useful signal affected by noise. In this example, it is very important not to lose information regarding the values of the samples of the transform signal St as this defines the noise removal capabilities of the system. In order to do so, the processing logic 210c is configured 211c to modify the input digital signal S1 in order to obtain a modified input digital signal S1', which is formed of suitable coefficients. All embodiments discussed with reference to FIG. 200a can be applied to the modification of input digital signal by the processing logic 200c. More specifically, the values of samples of the input digital signal S1 can be viewed as target values, while the modified input digital signal S1' is formed of suitable values, as defined with reference to FIG. 2a.

The processing logic is further configured 212c to perform a convolution of the modified input digital signal S1' with the transform signal St. The use of suitable coefficients by the modified digital signal thus allows to use a number of additional bits as low as possible for the input digital signal, and thus not to lose information from the transform signal St.

In a number of embodiments of the invention, the processing logic 210c is configured to modify the input digital signal by replacing odd values in the input digital signal S1 by even values that can be coded using a lesser number of bits. For example, if the input digital signal S1 is an audio signal having a bit depth of 14, a value of a sample equal to 15 719 corresponds to an amplitude of the audio signal 15 $719/2^{14}$, which cannot be simplified. Therefore, this value of the audio sample requires 14 bits to be coded. On the contrary, the nearby values 15 718 and 15720 respectively correspond to amplitudes of the audio signal equal to 15 $718/2^{14} = 7859/2^{13}$ and 15 $720/2^{14} = 1965/2^{11}$, which respectively require 13 and 11 bits to be coded. This means that all significant information for the value 15720 is located in the 11 most significant bits rather than in the 14 bits if the input digital signal. Such a value thus naturally limits the degradation caused by the conversion of the output digital signal by a converter having a limited conversion accuracy. Therefore, a value 15719 in the input digital signal can be replaced by 15720. This introduces a limited distortion of the input digital signal, while greatly improving the accuracy of the future conversion of the output digital signal.

More generally, each odd value in the input digital signal can be replaced by its upper or lower neighbor value, which is a multiple of 4.

Such solution of reduction of the number of bits by the use of nearby values can also be used iteratively to select a suitable value that uses a number of additional bits as low as possible within an error range around a target value. For example, the initial value is written in the form $$\frac{k}{2^n}, \frac{15719}{2^{14}}$$

in the example above. Then, if k is an even number, the fraction can be simplified up to a fraction $$\frac{k_1}{2^{n_1}},$$

with $k_1$ odd. The two neighboring values $$\frac{k+1}{2^n} \text{ and } \frac{k-1}{2^n}, \text{ or } \frac{k_1-1}{2^{n_1}} \text{ and } \frac{k_1+1}{2^{n_1}}$$

are selected. In the example above, the values 15 $178/2^{14}$ and 15 $720/2^{14}$ are the neighbouring values. Each value that is within the error range is selected as a candidate value. Each of these values has an even numerator, and thus can be simplified down to a fraction of a lesser power of two. Therefore, each of these values requires a lower number of bit. For each selected candidate value, the corresponding fraction is simplified to be expressed as a fraction with an odd numerator. For example, if k=15 719 and n=14, and the neighboring value $$\frac{k+1}{2^n} = \frac{15719+1}{2^{14}} = \frac{15720}{2^{14}} = \frac{1965}{2^{11}}$$

is selected, the fraction is simplified to $$\frac{k'}{2^{n'}} = \frac{1965}{2^{11}}$$

in order to have an odd numerator. Then two new candidates $$\frac{k'+1}{2^{n'}} = \frac{1966}{2^{11}} \text{ and } \frac{k'-1}{2^{n'}} = \frac{1964}{2^{11}}$$

are selected, which require at least one fewer additional bits. If at least one of these values is within the error range, the process continues until the best suitable values that uses the minimum number of additional bits and is within the error range, is selected.

This example demonstrates that the invention can be used in any convolution of digital signal, by using suitable coefficients in one of the two signals, to preserve as much information as possible in the other digital signal.

In the example discussed with reference to FIG. 2c, a bit requirement optimization is applied only on the digital input signal. However, it is also possible to obtain both the digital input signal by applying a bit requirement optimization on a target digital input signal, and the transform signal by applying a bit requirement optimization on a target transform signal.

Figure 3:
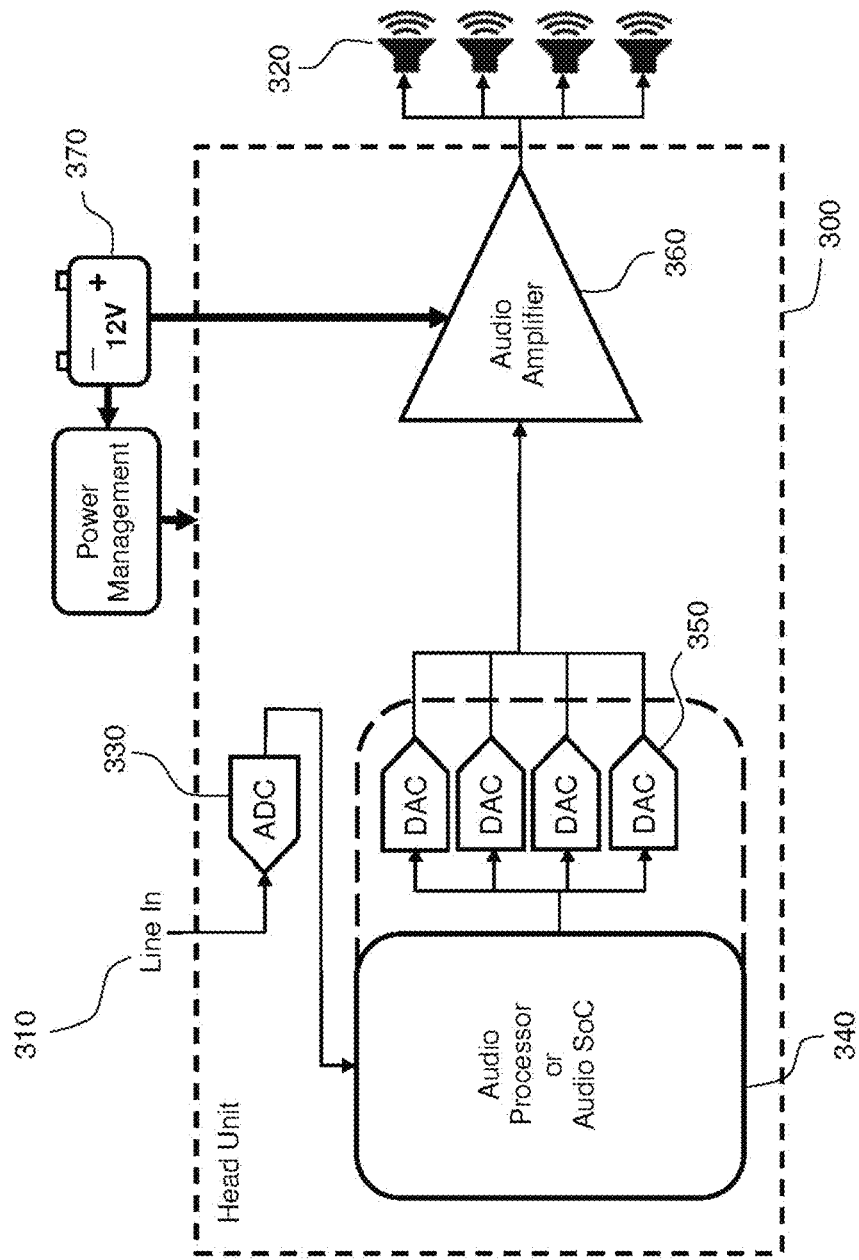
FIG. 3 displays an example of a system for managing audio devices in a car in a number of embodiments of the invention.

FIG. 3 displays an example of a system for managing audio devices in a car in a number of embodiments of the invention.

The system 300 is configured to transform and play an input analog audio signal 310 using loudspeakers 320 in the interior of a car. In the example of FIG. 3, four loudspeakers are placed within the interior of the car. However this example is not limitative, and a different number of loudspeakers may be used, for example the interior of the car may comprise 2 or 6 loudspeakers.

The input analog audio signal 310 is an analog audio signal that can be obtained from a variety of sources, for example an audio tuner, or an analog input from an external device such as an audio player.

The input analog audio signal is converted to an input digital audio signal using a ADC (Analog to Digital Converter) 330. The input digital audio signal is processed by an audio processor or audio SoC (Signal on Chip) 340 to obtain a output digital audio signal for each loudspeaker (four in the example of FIG. 3). Each output digital audio signal is converted to an output analog audio signal by one of the DACs 350. Each output analog audio signal is amplified by an amplifier 360 to be played by one of the loudspeakers 320. The system 300 and audio amplifier 360 may be powered by a battery 370 of the car.

The audio processor 340 can be configured to perform one or more transforms to the input digital audio signal. For example, the audio processor can perform a modification of the amplitude of the input digital audio signal. The audio processor can also be configured to apply a transform to the input digital audio signal, in order to cancel a distortion created by the shape of the interior of the car. Indeed, the shape of the interior of the car impacts the propagation of audio sound within the interior. This can create distortions when playing the audio signal. In order to cancel these distortions, the audio processor is configured to apply a transform to the input digital audio signal to obtain the output digital audio signals. This transform can be obtained by performing a convolution of the input digital audio signal with a transform signal to apply a FIR filter representative of the transform.

In order to prevent a loss of information from the input digital signal during analog conversion by the DACs 350 using a limited number of bits of conversion, the values samples of the transform signal used by the audio processor 340 are selected among suitable values as defined with reference to the FIGS. 2a, 2b and 2c. The values of the samples of the transform signal can notably be calculated by:
- calculating target values of the samples corresponding to an ideal filter to cancel the distortion created by the shape of the car;
- determining a set of suitable values taking into account the number of bits of conversion of the DACs 350;
- selecting the values of the samples of the transform signal among suitable values based on the target values of the ideal filter.

The system 300 thus allows an application of a filter whose impulse response is similar to the impulse response of the ideal filter, while preventing a loss of information from the input digital signal. Therefore, the system 300 improves the audio listening experience of the users within the car.

Figure 4:
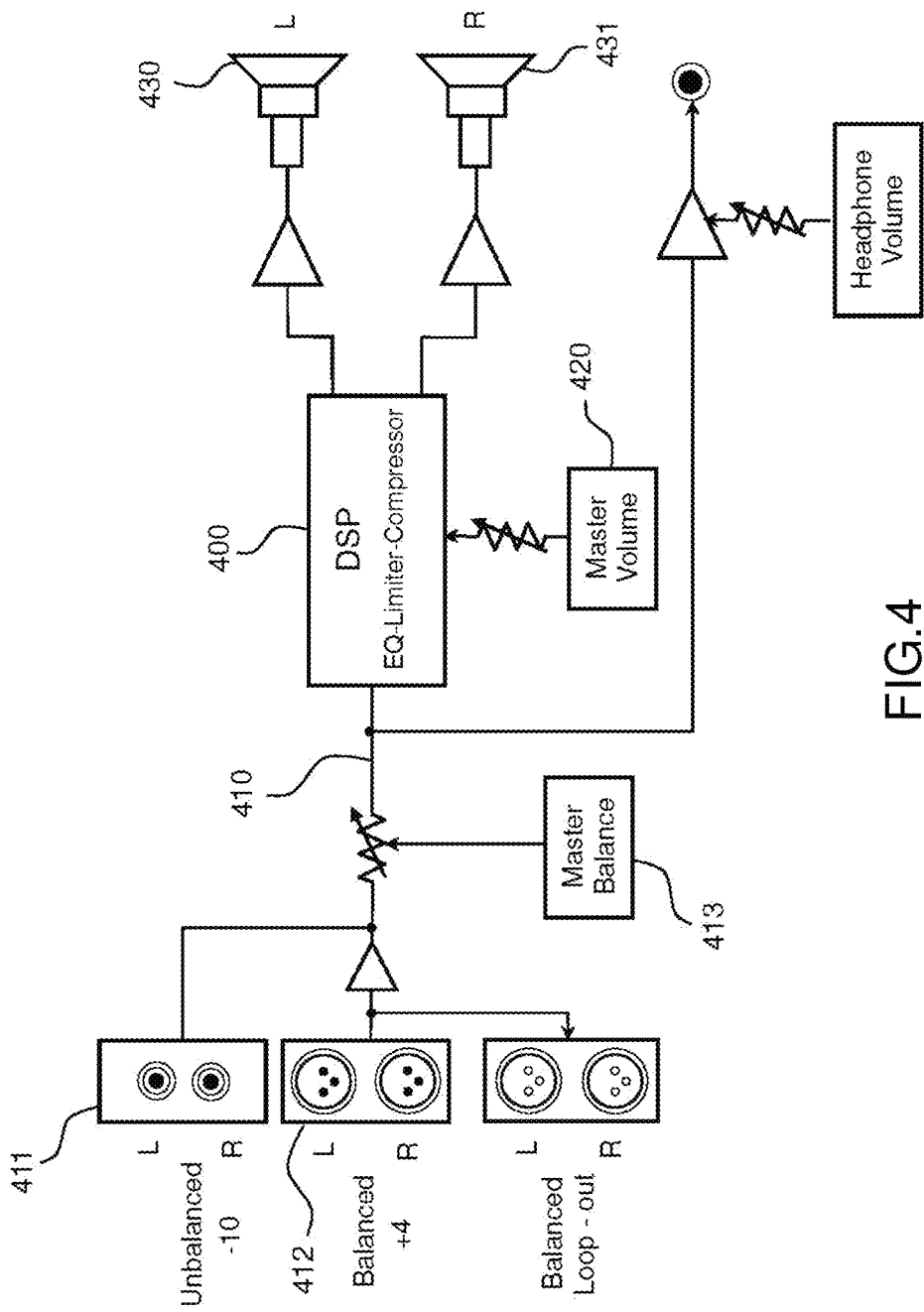
FIG. 4 displays an example of a compressor device in a number of embodiments of the invention.

FIG. 4 displays a compressor device in a number of embodiments of the invention.

The compressor 400 uses as input signal an analog stereo signal 410 formed from an unbalanced stereo signal 411, a balanced stereo signal 412, the balance being controlled by the master balance 413.

The compressor 400 is configured to reduce the volume of loud sound and amplify the volume of quiet sounds in order to reduce the dynamic range of the audio signal.

In order to do so, the compressor 400 converts the analog input signal 410 into a digital input signal, determines compression gains corresponding to the different amplitudes of the input digital signal, and applies the compression gains depending on the amplitudes of the input digital signal to obtain an output digital signal, then converts the output signal into output analog signals to be played on the loudspeakers 430, 431.

In order to avoid losses of information from the output signals, and therefore degradations, the compressor 400 determines, for each gain to apply, a suitable value of the invention that best match the gain, and reduces the number of additional bits used by the compression, according to one or more embodiments of the invention discussed above.

This allows using a digital compressor while avoiding as much as possible issues that may arise when converting back digital output signals into analog output signals.

Figure 5:
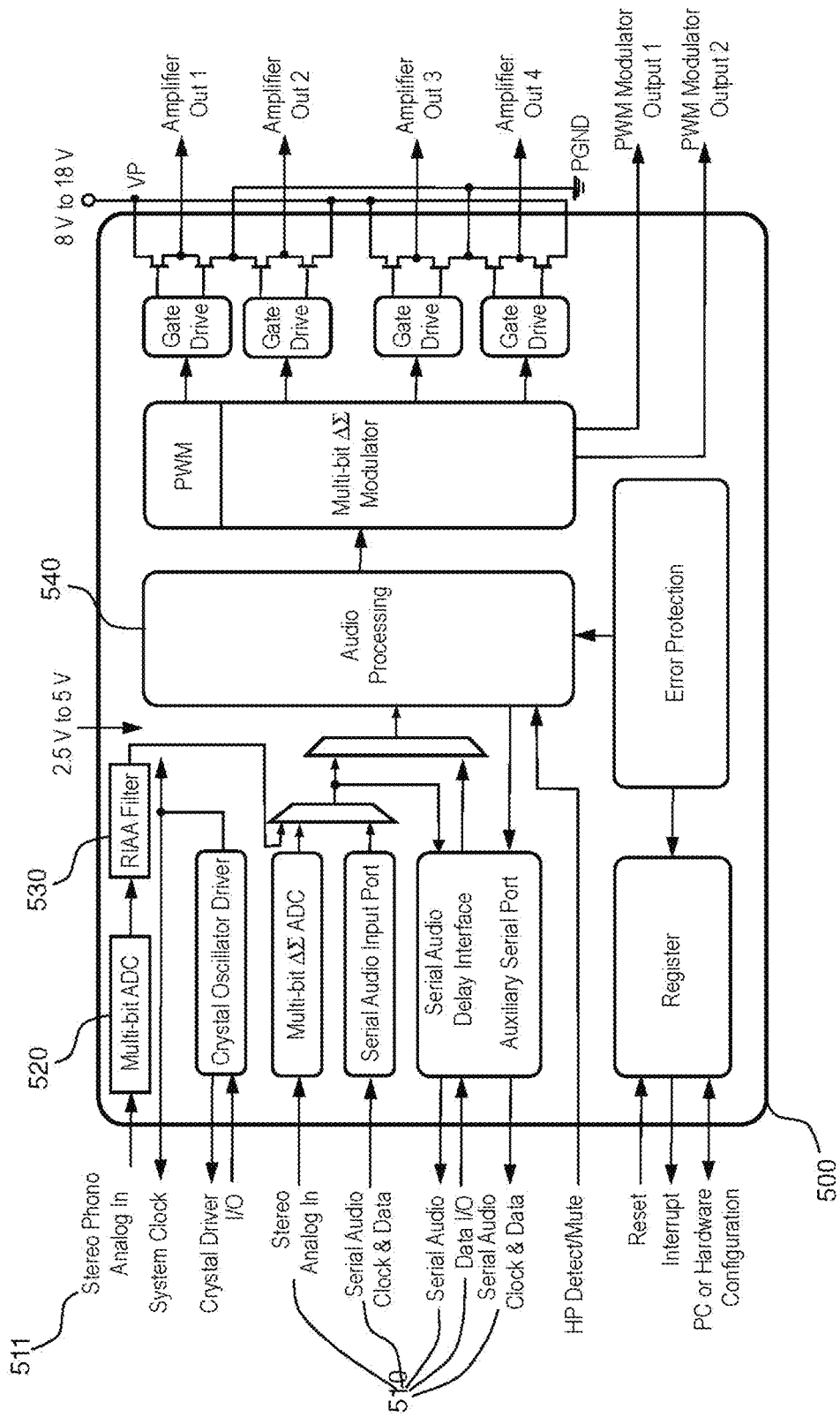
FIG. 5 displays an example of an audio amplifier device in a number of embodiments of the invention.

FIG. 5 displays an example of an audio amplifier device in a number of embodiments of the invention.

The audio amplifier device 500 uses as input a number of audio input channels 510.

In addition, the amplifier device 500 comprises an analog audio input 511, that is converted using an ADC 520. The analog audio input 511 is an input from a phonograph record. The device 500 comprises a processing logic to apply a RIAA (Recording Industry Association of America) equalization filter on the converted audio input. The RIAA equalization filter is a filter that applies a variable gain to different frequencies of the signal, in order to cancel an equalization filter applied when recording phonograph records, to permit greater recording times and improve sound quality. The RIAA filter can be implemented using a convolution of a transform signal.

The amplifier device 500 further comprises a processing logic 540 configured to apply a number of different filters on the audio signal such as a change of volume, a high-pass filter, a crossover, etc. . . . All these filters may also be implemented using a convolution of a transform signal.

In order to avoid losses of information from the output signals, and therefore degradations, the compressor amplifier device 500 uses transform signals formed of suitable coefficients defined according to one or more embodiments of the invention discussed above.

This allows using all filters of the amplifier device 500 while avoiding as much as possible issues that may arise when converting back digital output signals into analog output signals.

Figure 6:
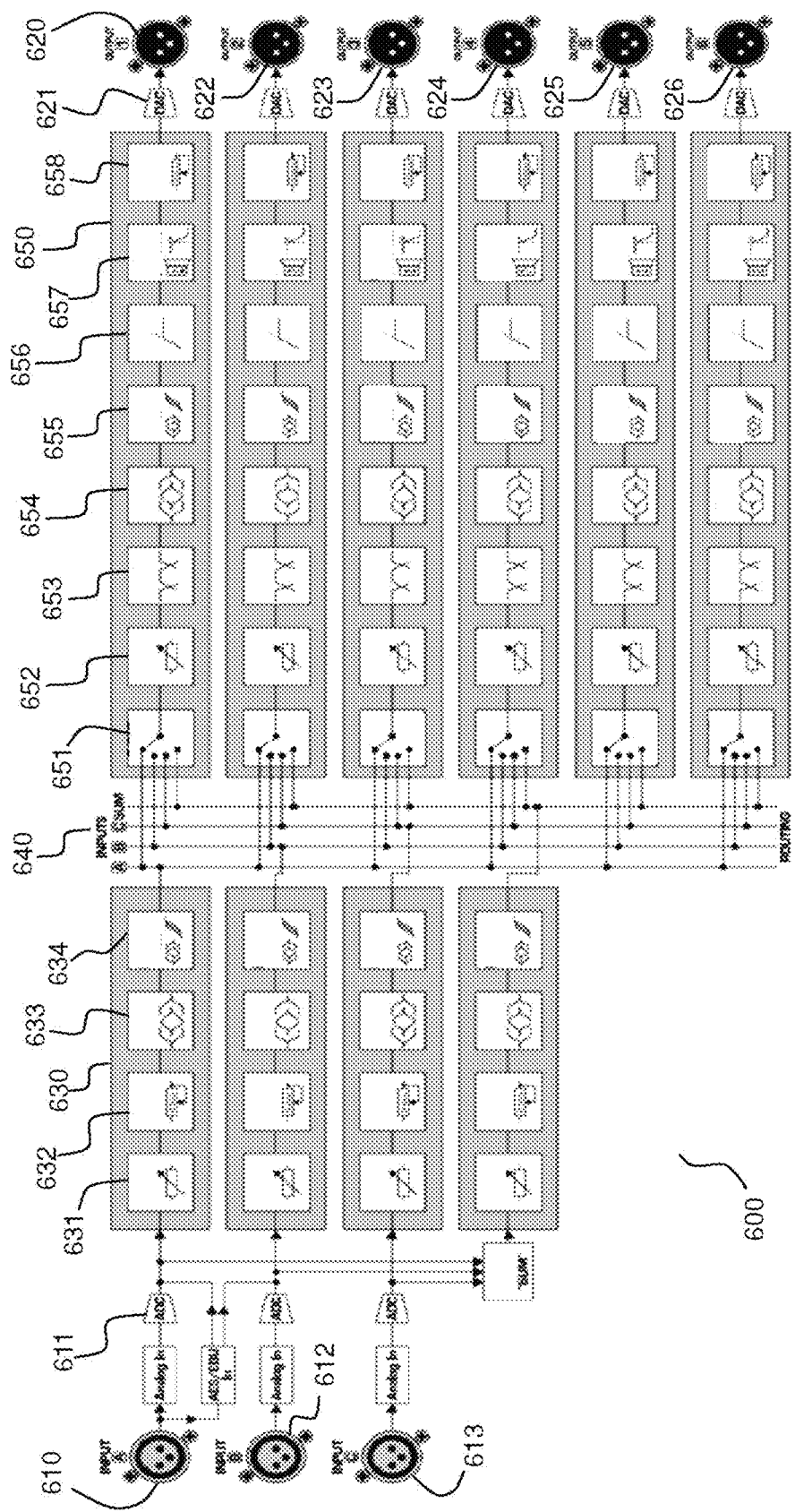
FIG. 6 displays an example of a high-fidelity processor in a number of embodiments of the invention.

FIG. 6 displays an example of a high-fidelity processor in a number of embodiments of the invention.

The high-fidelity processor 600 has three analog audio inputs 610, 612, 613, and 6 analog audio outputs 620, 622, 623, 624, 625 and 626. However this number is not limitative, and different numbers of analog inputs/outputs may be used. Although examples will be provided for the first input 610, and the first output 620, the description below is respectively applicable to all inputs and all outputs of the high-fidelity processor 600.

The analog audio input 610 is converted into a digital audio input by an ADC 611. Then a first processing logic 630 is configured to process the digital audio input by successively applying a gain 631, a delay 632, an equalization 633 and a dynamic equalization 634. The high fidelity processor 600 is configured 640 to connect every audio input to every audio output. A second processing logic is configured to process the digital audio output by successively selecting a digital audio input 651, applying a gain 652, performing crossover 653, an equalization 654, a dynamic equalization 655, applying a limiter 656, i.e a filter to progressively limit the amplitude of the signal when the gain of the signal is above a threshold, modify 657 the phase of the output, and applying a further delay 658. The output digital signal is then converted by a DAC 621 into an analog output signal, in order to be played by the loudspeaker 620.

As noted above, the applications of the gains 631 and 652 on a digital signal can, depending on the coefficients of gain which are used, cause distortions during the digital to analog conversion by the DAC 621. In order to prevent such distortion, the high fidelity processor is configured to use the suitable values of the invention to apply the gains 631 and 652.

This allows the high fidelity processor 600 to perform its operations on the digital signals without creating distortion during the conversion of the output digital signals into output analog signals.

Figure 7:
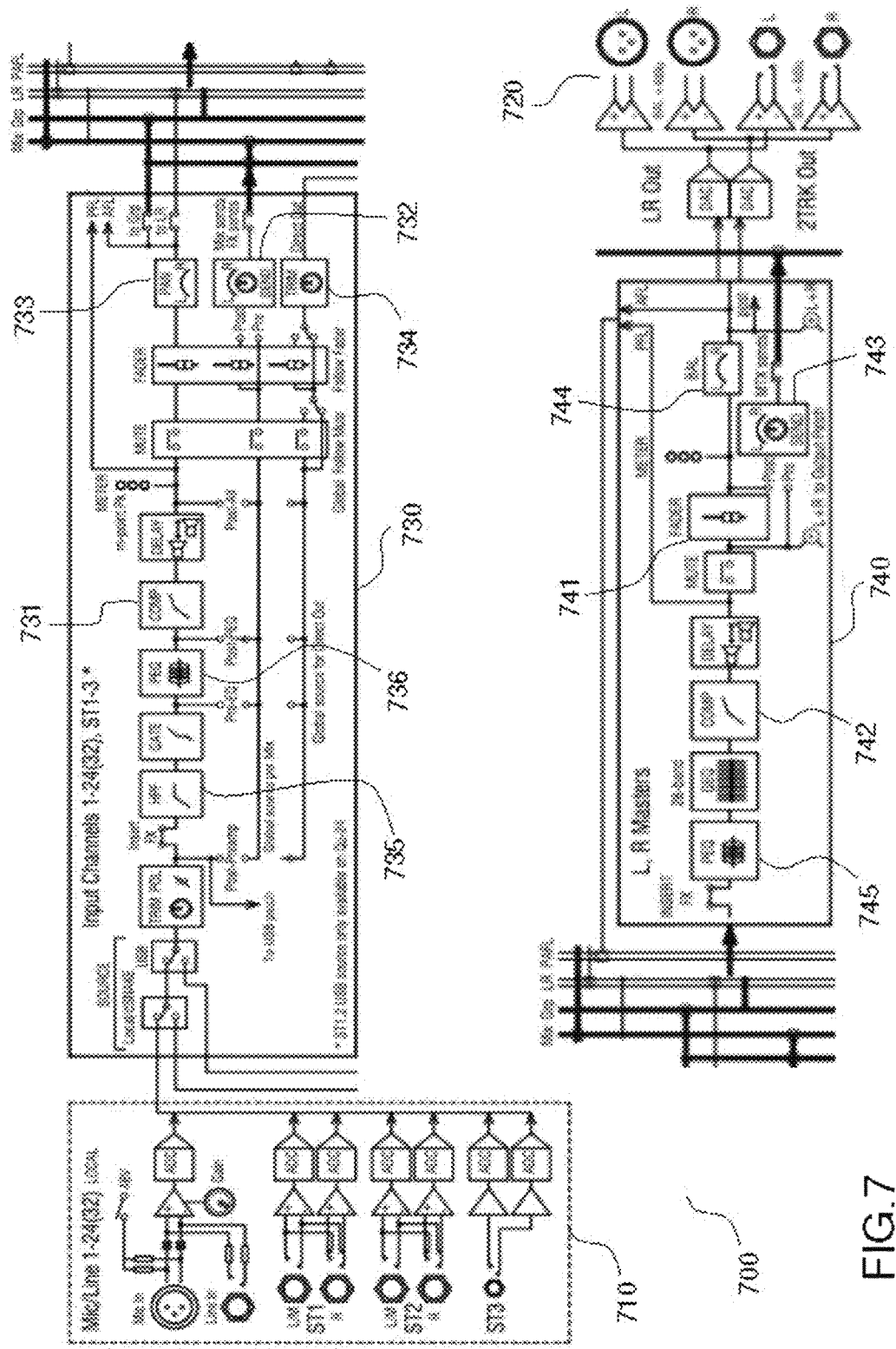
FIG. 7 displays an example of a mixer in a number of embodiments of the invention.

FIG. 7 displays an example of a mixer in a number of embodiments of the invention.

The mixer 700 has a number of analog audio inputs 710 to be converted into digital audio signals using ADCs. Such a mixer is for example used when recording audio tracks. The audio inputs correspond to a number of microphones that capture sounds, or synthesizer that produce sound, and the mixer combines audio inputs into a number of audio channels to be recorder. FIG. 7 displays the operations on a single input channel, and a single output channel. However such operations can be performed on each input and output channel. In order to mix input channels into output channels, the mixer 700 performs a number of operations 730 on the input digital signals, and a number of operations 740 on output digital signals. These operations comprise for example a fader 741, a compressor 731, 742, mix send controls 732, 743 defining the gain to apply to input signal to be send to mix, a balance control 744 that applies inverse gains on a left and right channels, and a pan control 733 that defines of position of a channel in the audio scene by applying variable gains in the outputs, an attenuator 734, a high pass filter 735, parametric equalizations 736, 745.

The digital output signals thus created are converted into analog output signals using DACs.

In order to prevent losses of information, and degradations during the digital to analog conversion, the mixer 700 is configured to use the suitable values of the invention to one or more for the operations described above.

This allows the mixer 700 to perform its operations on the digital signals without creating distortion during the conversion of the output digital signals into output analog signals.

Figure 8:
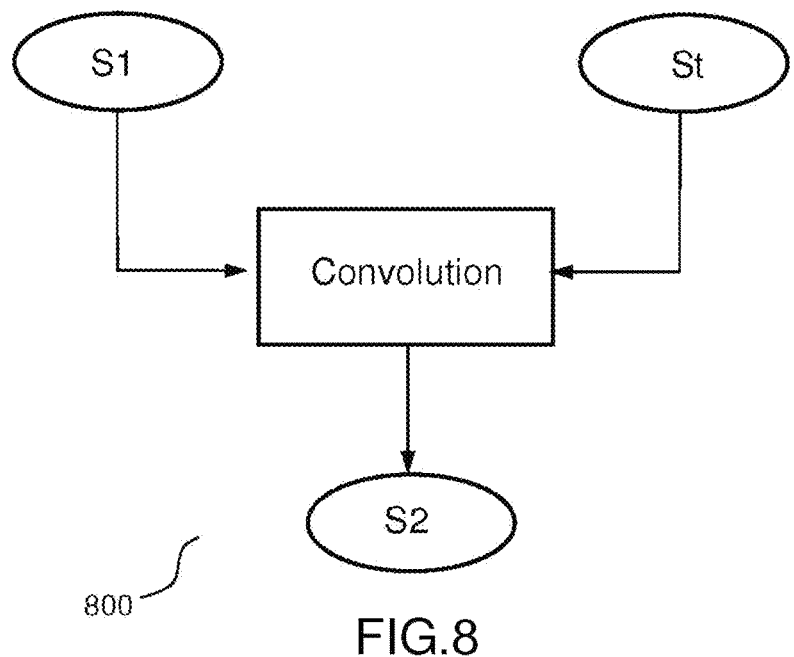
FIG. 8 displays a method to perform a convolution of two digital signals in a number of embodiments of the invention.

The FIG. 8 displays a method to perform a convolution of two digital signals in a number of embodiments of the invention.

The method 800 is a method of convolution of an input digital signal S1 with and a digital signal representative of a transform St to obtain an output digital signal S2. The method 800 is remarkable in that one of said input digital signal and digital signal representative of a transform comprises one or more samples whose values belong to a discrete set of suitable values, wherein:
  said discrete set of suitable values is defined at least by a decreasing function defining a number of bits as a function of the absolute values of said suitable values;
  each suitable value is equal to a division of a first integer number by two raised to the power of a second integer number, said second integer number being equal to or below a ceiling of the application of the decreasing function to the absolute value of said suitable value.

Similarly to the devices of the FIGS. 2*a*, 2*b*, 2*c*, the use of suitable values of the invention for one of the two digital signals allows preserving the information from the second one within the most significant bits of the output digital signal S2, and therefore prevent a loss of information an degradation upon a conversion of the output digital signal S2.

Figure 9:
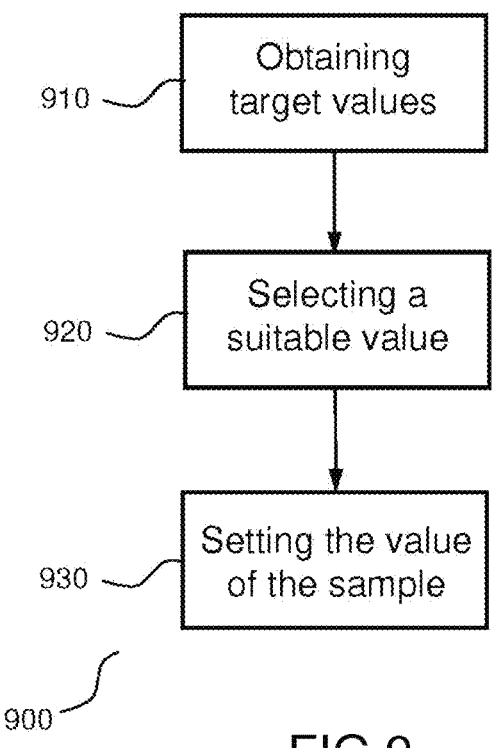
FIG. 9 displays a method of creation of a first digital signal to be convolved with a second digital signal according to the invention.

The FIG. 9 displays a method of creation of a first digital signal to be convolved with a second digital signal according to the invention.

The method 900 is a method of creation of a first digital signal. The first digital signal is to be convolved with a second digital signal. In order to prevent a loss of information from the second digital signal upon convolution to obtain an output digital signal, and conversion of the output digital signal, the method 900 comprises:
  obtaining (910) target values of samples the first digital signal;
  for each target value of a sample, selecting (920) a suitable value belonging to a set of suitable values, wherein:
  said discrete set of suitable values is defined at least by a decreasing function defining a number of bits as a function of the absolute values of said suitable values;

each suitable value is equal to a division of a first integer number by two raised to the power of a second integer number, said second integer number being equal to or below a ceiling of the application of the decreasing function to the absolute value of said suitable value;

setting (930) the value of the sample to the suitable value.

This allows the first digital signal to be as close as possible to a target digital signal, while being formed of suitable values to prevent a loss of information from the second digital signal when performing the convolution, then conversion of the output digital signal.

Figure 10A:
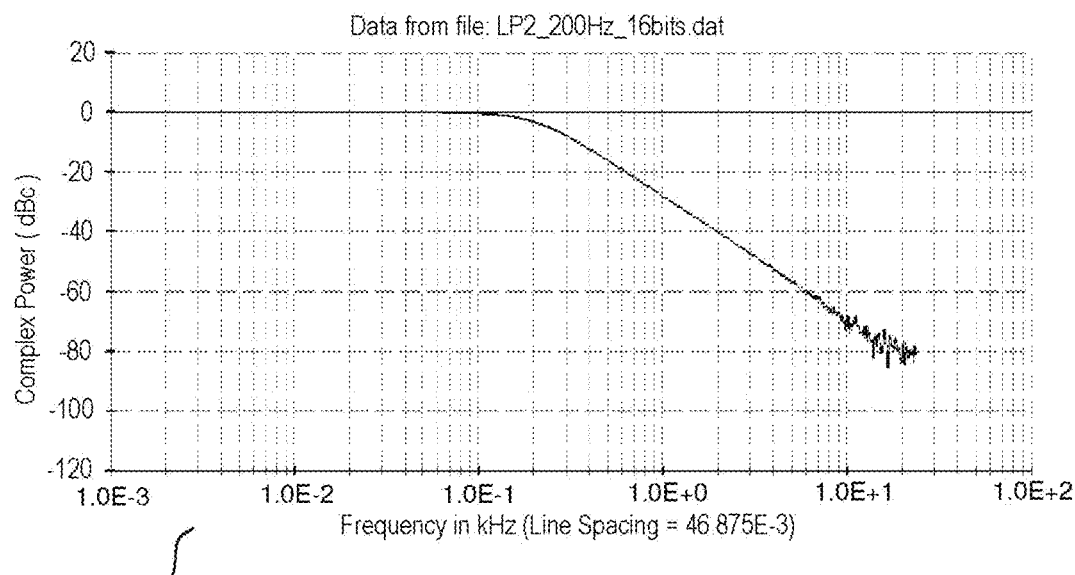
FIGS. 10a, 10b and 10c display respectively the frequency response of a prior art lowpass filter whose coefficients are quantized using 16 bits, the frequency response of a lowpass filter of the invention, and the impulse response of a lowpass filter of the invention.
Figure 10B:
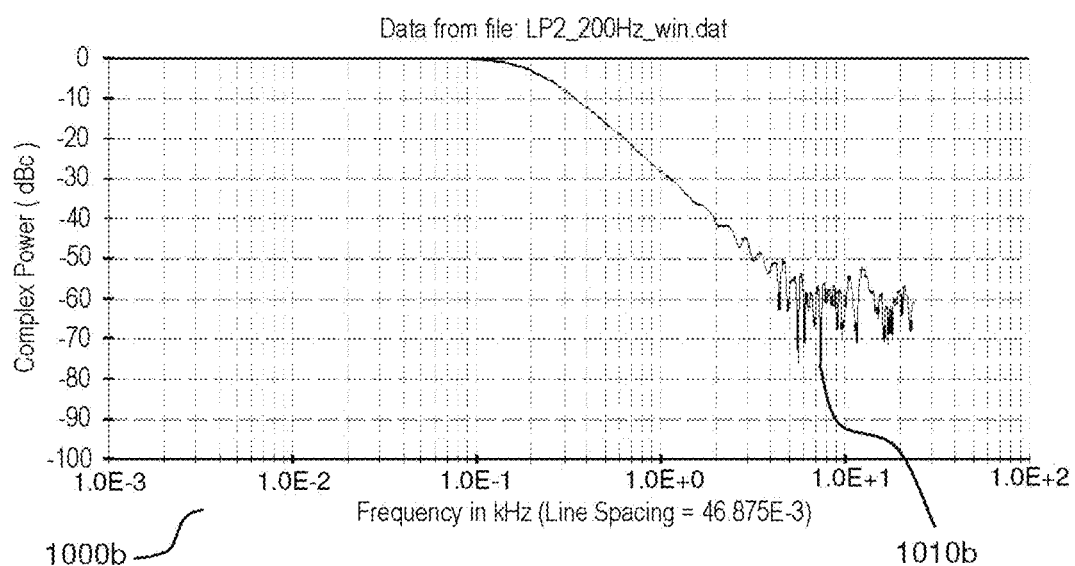
Figure 10C:
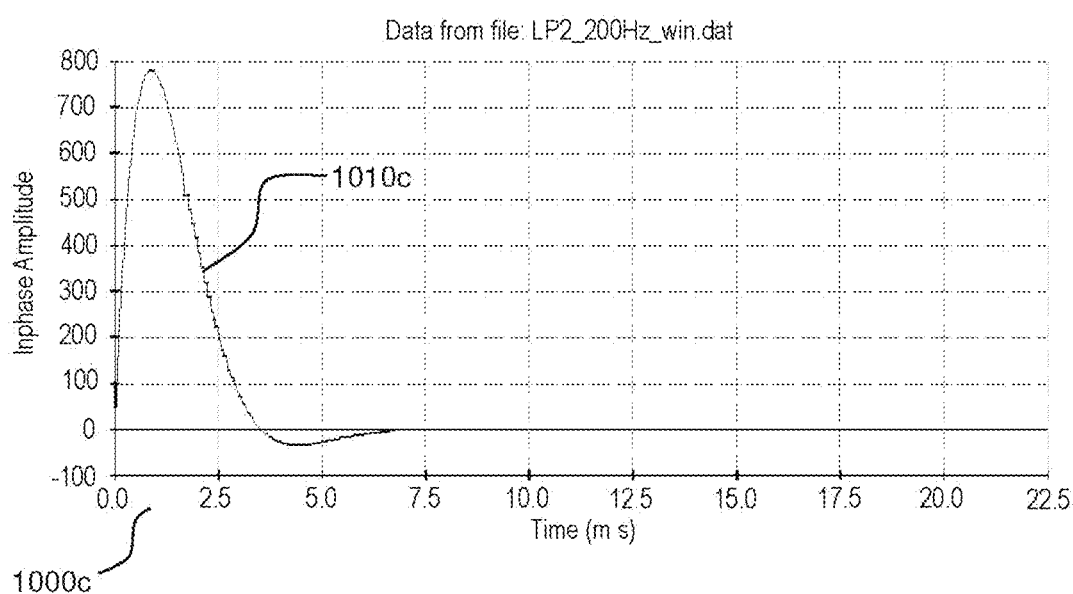

FIGS. 10a, 10b and 10c display respectively the frequency response of a prior art lowpass filter whose coefficients are quantized using 16 bits, the frequency response of a lowpass filter of the invention, and the impulse response of a lowpass filter of the invention.

The curve 1000a represents the frequency response of a 200 Hz low pass filter of the prior art quantized using 16 bits, as a power depending on the frequency. The curve 1000b represents the frequency response of a corresponding low pass filter of the invention, that is to say a low pass filter whose coefficients have been replaced by suitable coefficients of an invention. The curve 1000c represents an impulse response of the same low pass filter of the invention, as an amplitude as function of time.

It can be seen 1010b that, at high frequencies, the frequency response is modified. However this impacts only frequencies that are affected by a very strong attenuation, and the overall functionality of the filter is not affected. It can also be seen 1010c in the impulse response that certain values have been modified to match only the set of suitable values.

Figure 11A:
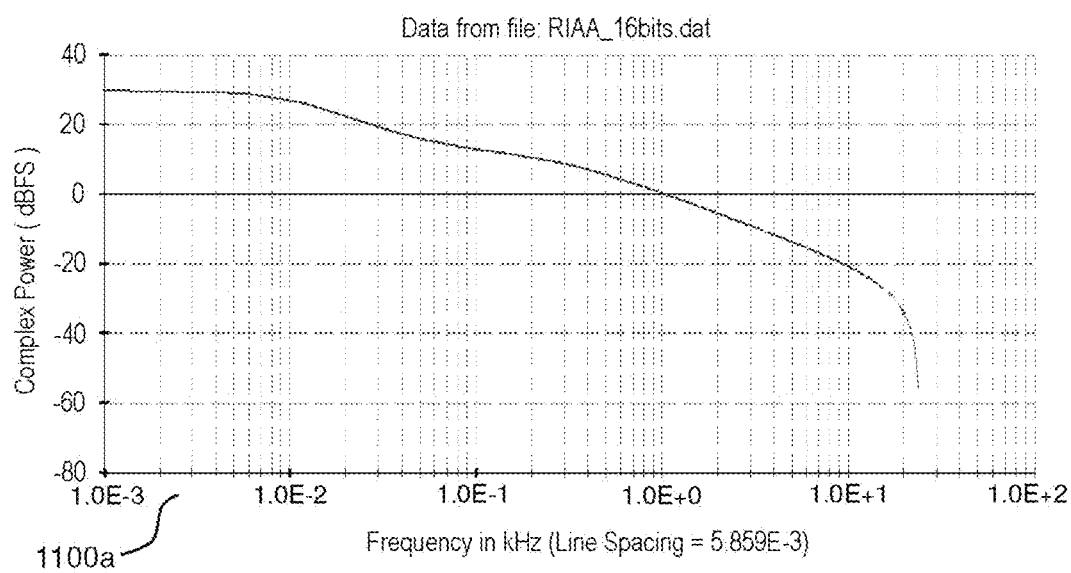
FIGS. 11a, 11b and 11c display respectively the frequency response of a prior art RIAA filter whose coefficients are quantized using 16 bits, the frequency response of a RIAA filter of the invention, and the impulse response of a RIAA filter of the invention.
Figure 11B:
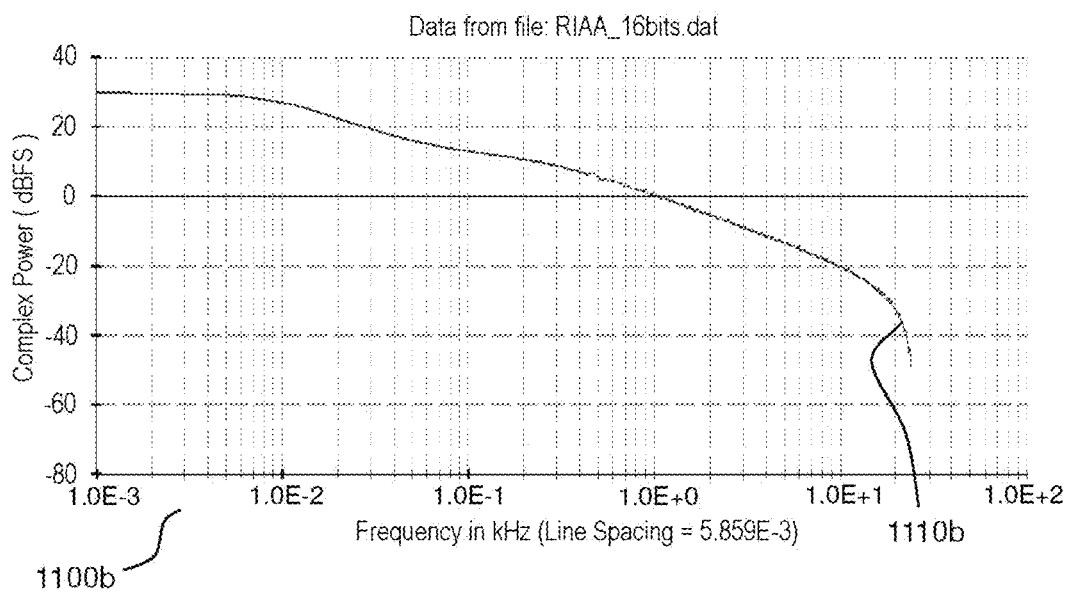
Figure 11C:
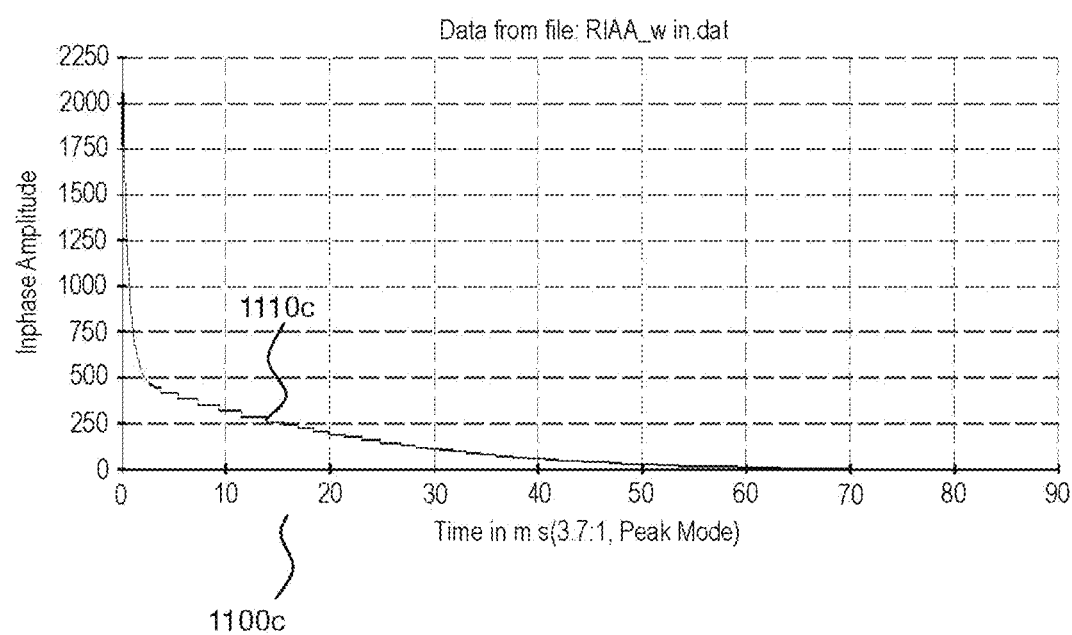

FIGS. 11a, 11b and 11c display respectively the frequency responses of a prior art RIAA filter whose coefficients are quantized using 16 bits, the frequency response of a RIAA filter of the invention, and the impulse response of a RIAA filter of the invention.

The curve 1100a represents the frequency response of a RIAA filter of the prior art quantized using 16 bits, as a power depending on the frequency. The curve 1100b represents the frequency response of a corresponding RIAA filter of the invention, that is to say a RIAA filter whose coefficients have been replaced by suitable coefficients of an invention. The curve 1100c represents an impulse response of the same RIAA filter of the invention, as an amplitude as function of time.

In this example, different numbers of bits of precision have been used, in the filter of the invention, for different samples. More specifically, a higher number of bits of precision have been used for the samples that have a steep variation from one sample to another. It can thus be seen 1110c that, when the variation between successive samples decreases, the number of bits of precision used to represent the samples is also reduced, in order to prevent losses of information.

Thus, more precision is provided in the first part of the impulse response. This ensures that the overall shape of the frequency response 1100b is preserved, while using a number of additional bits of precision as low as possible for each sample.

These examples demonstrate that the invention does not significantly impact the performance of filters, while greatly reducing the loss of information from the input digital signal upon conversion of the output digital signal using a limited number of bits.

In a number of embodiments of the invention, the transform is an oversampling of the input digital signal, sometimes termed an upsampling. Oversampling can be used before a Digital to Analog Conversion, by converting the input digital signal to a sampling frequency significantly higher than the original sampling rate. In such applications, the transform can be performed by a convolution of the input digital signal and a transform signal representative of the oversampling, that is to say by applying to the input digital signal a FIR filter defining the oversampling. A number of different oversampling FIR filter exist. For example, the oversampling FIR filter can be a moving average filter.

As explained above, a DAC to which the oversampled signal is submitted to has a limited input bit depth. Therefore, some information from the input digital signal may be lost during digital to analog conversion. More specifically, the oversampled samples comprise information from a large number of different samples from the input digital signal (for example, if the oversampling is performed using a moving average filter, the oversampled signal may comprise information from all input samples of the moving average). An excessive loss of information may cause distortion that reduces the quality of the oversampled signal at the output of the digital to analog conversion.

In order to solve this issue, the disclosure applies to oversampling, by applying a bit requirement optimization of one of the input digital signal, and the transform signal defining the oversampling. As explained above, the application of the bit requirement optimization to the transform signal (for example a transform signal whose sample correspond to the coefficients of an oversampling FIR filter) allows preserving as much information as possible from the input digital signal, and thus improves the quality of the resulting oversampled signal. Meanwhile, the application of the bit requirement optimization to the input digital signal advantageously allows obtaining a more precise oversampling.

As noted above, in the framework of the invention, the bit requirement optimization comprises the definition of a value of a sample of said at least one of said input digital signal and said digital signal representative of a transform as a division of a first integer number by two raised to the power of a second integer number. In the examples provided above, the bit requirement optimization comprises the application of a decreasing function of the values of the target samples.

However, the bit requirement optimization may use other functions to define the second integer number. For example, the second integer may be comprised between a minimum value and a maximum value, and/or be equal to the application of an increasing function of the absolute difference between the target sample and the expression of the target sample as a first integer divided by two raised to the power of the minimum value. That is to say, the higher the degradation caused by a reduction of the number of bits used to define the sample, the higher the number of bits used. As an advantage, this allows achieving a reduction of the number of bits needed for performing a convolution of signal, while limiting the error introduced by the bit requirement optimization. Such bit requirement optimization may be applied to a target signal which is an input digital signal as well as a transform digital signal.

For example, the bit requirement optimization may be defined such that:
  the target digital signal (for example, the input digital signal, or a transform digital signal representing the coefficients of a FIR filter) is coded using a number C of bits. The samples of the target digital signal are noted h(i), and are thus equal to $$h(i) = \frac{kh(i)}{2^C},$$

wherein kh(i) is an integer number;
  a minimum number of bits K to code the signal at the output of the bit requirement optimization is defined, so that 1<K<C. Each sample of the digital signal thus has a converted counterpart k(i) corresponding to the sample expressed on C bits, thus expressed as:

$$k(i) = \frac{kk(i)}{2^K},$$

wherein kk(i) is an integer number;
  for some values, we have h(i)=k(i). For some other values, the converted counterpart k(i) may be slightly different from h(i);
  a relative difference v(i) is calculated for each sample, corresponding to the absolute difference of the distortion introduced by the conversion from C to K bits divided by the value h(i) of the sample: v(i)=0 if h(i)=0; v(i)=|(h(i)−k(i))|/h(i) otherwise.

The relative difference v(i) is thus representative of a ratio between the distortion introduced by the conversion of the samples from C to K bits divided by the values of the samples: the higher v(i) is, the higher is the relative degradation introduced by the conversion of the bit depth for a sample. In a number of embodiments of the invention, the second integer (i.e the bit depth used for a sample at the output of the bit requirement optimization) is an increasing function of v(i): the higher the relative degradation introduced by sample conversion, the higher the number of bits of information used to reduce the loss of information of the sample.

For example, the second integer number n may be comprised between K and K+D, where D is a integer>1 with 0≤D≤C−K. A rule of definition of n may be used:

if $v(i) < \frac{1}{2^{C-K}}, n = K$;

else if $\frac{1}{2^{C-K}} \leq v(i) < \frac{1}{2^{C-K-1}}, n = K+1$;

else if $\frac{1}{2^{C-K-1}} \leq v(i) < \frac{1}{2^{C-K-2}}, n = K+2$;

... ;

else if $\frac{1}{2^{C-K-(D-2)}} \leq v(i) < \frac{1}{2^{C-K-(D-1)}}, n = K+(D-1)$;

else if $\frac{1}{2^{C-K-(D-1)|}} \leq v(i), n = K+D$.

Thus, the second integer n is calculated between K and K+D, in order to have a value that reduces the relative degradation generated by the bit requirement optimization.

Figure 12A:
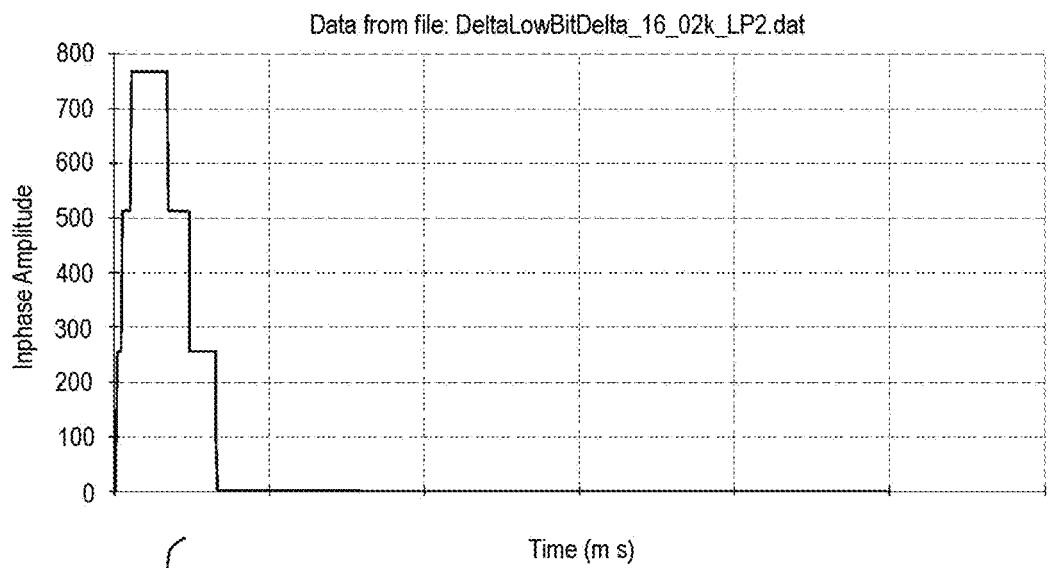
FIGS. 12a, 12b and 12c represent respectively the impulse responses of a low pass filter using 8-bits coefficients, 16-bits coefficients, and 8 to 16 bits coefficients using a bit requirement optimization according to the invention.
Figure 12B:
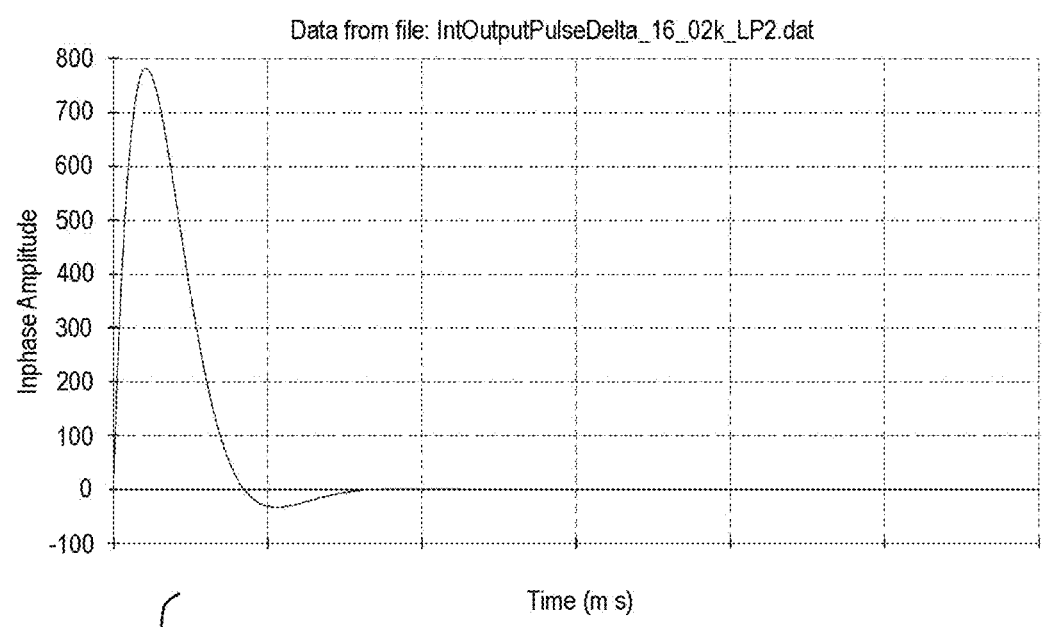
Figure 12C:
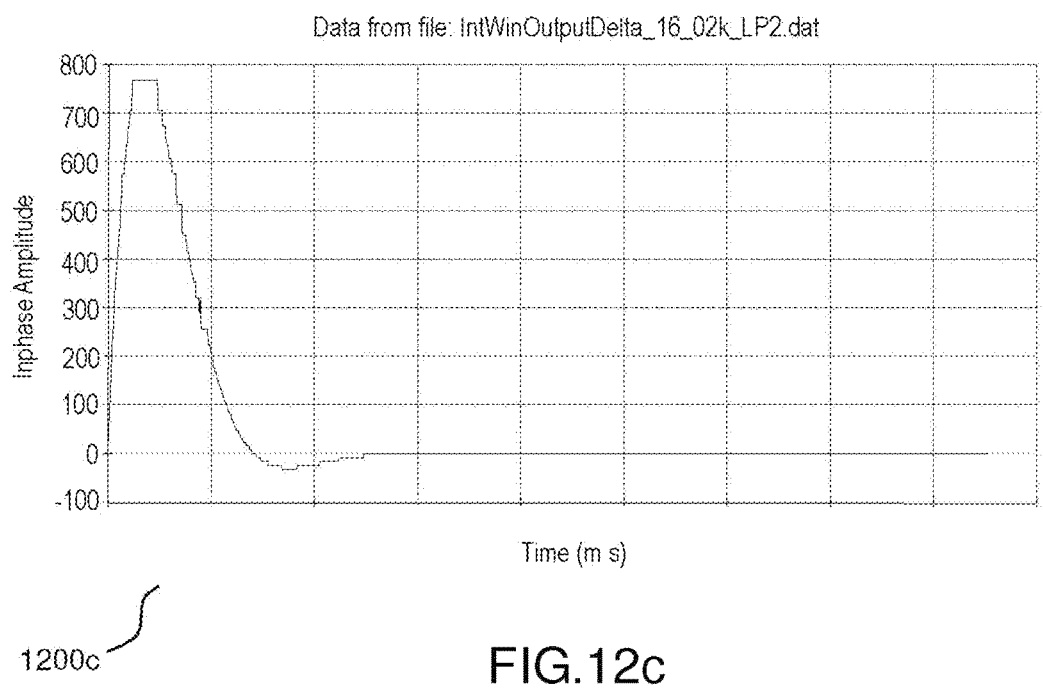

The FIGS. 12a, 12b and 12c respectively represent the impulse responses of a low pass filter using 8-bit coefficients, 16-bit coefficients, and 8 to 16 bits coefficients using a bit requirement optimization according to the invention.

The impulse response 1200a is the impulse response of a low-pass filter using 8-bits coefficients. As shown by FIG. 12a, the impulse response is very imprecise. The impulse response 1200b is a impulse response of the same low-pass filter using 16-bit coefficients. This impulse response is much more precise but, as explained above, a convolution with a FIR filter having 16 bits, greatly increases the bit depth of the convoluted signal; if the convoluted signal is converted using a limited bit depth afterwards, there will be an important degradation of quality.

The impulse response 1200c is a impulse response of the same low-pass filter using the bit requirement optimization described above, wherein the second integer n corresponding to the bit depth of each coefficient is calculated as a growing function of v(i) for each coefficient. The resulting impulse response 1200c is much more precise than the impulse response 1200a. This demonstrates the ability of the bit requirement optimization of the invention to retain an important quantity of information from the target signal, while reducing the number of bits needed at the output of a convolution with the optimized signal.

It is also possible to replace the value v(i) by a value $w(i)=|h(i)-k(i)|/2^{(C-K)}$. The value of the second integer n is then calculated in the same way as explained before, using w(i) instead of v(i). Therefore, the number of bits used to code a sample is chosen in order to reduce the absolute degradation caused by the conversion.

The examples described above are given as non limitative illustrations of embodiments of the invention. They do not in any way limit the scope of the invention which is defined by the following claims. Furthermore, any non-exclusive embodiments or examples discussed above may be combined. For example, although FIGS. 2a and 2b discloses devices in which the values of the transform signal are selected among suitable values/obtained by a bit requirement optimization, and FIG. 2c discloses a device in which the values of the input digital signal are selected among suitable values/obtained by a bit requirement optimization, in a number of embodiments of the invention, both the values of the input digital signal, and the transform signal may be selected among suitable values/obtained by a bit requirement optimization, in order to obtain a joint optimization.

The invention claimed is:

1. A digital circuitry configured to perform a convolution of an input digital signal and a digital signal representative of a transform to obtain an output digital signal, at least one of said input digital signal and said digital signal representative of a transform comprising one or more samples obtained by a bit requirement optimization of a target digital signal.

2. The digital circuitry of claim 1, wherein the transform is an oversampling of the input digital signal.

3. The digital circuitry of claim 1, wherein said bit requirement optimization comprises the definition of a value a sample of said at least one of said input digital signal and said digital signal representative of a transform as a division of a first integer number by two raised to the power of a second integer number.

4. The digital circuitry of claim 3, wherein said second integer number is equal to or below a ceiling of the application of a decreasing function defining a number of bits to the absolute value of a target sample of the target digital signal.

5. The digital circuitry of claim 4, wherein said decreasing function defines a number of bits equal of below a maximum number of bits.

6. The digital circuitry of claim 4, wherein the decreasing function is a number of bits of precision minus a binary logarithm of the absolute value of said absolute value of the target sample of the target digital signal.

7. The digital circuitry of claim 6, wherein the number of bits of precision is defined according to a target precision of the transform.

8. The digital circuitry of claim 7, wherein the value of the bit requirement optimization comprises the selection of the value of the sample among a set of suitable values based on the target value of the target sample.

9. The digital circuitry of claim 8, wherein the number of bits of precision is equal to a ceiling of a binary logarithm of a target number of suitable values in a range having the form $[\frac{1}{2}^{N+1}; \frac{1}{2}^N]$.

10. The digital circuitry of claim 9, wherein the number of suitable values in a range having the form $[\frac{1}{2}^{N+1}; \frac{1}{2}^N]$ is equal to 6 divided by an average target step between two suitable values, in dB.

11. The digital circuitry of claim 8, wherein the set of suitable values is further defined by a maximum suitable value, and comprises:
    two raised to the power of the number of bits of precision values, respectively equal to:
        a first integer value from 1 to two raised to the power of the number of bits of precision divided by
        two raised to the power of the maximum number of bits;
    for each range in a plurality of ranges defined by a second integer value comprised between a binary logarithm of said maximum suitable value and the maximum number of bits minus one:
        two raised to the power of the number of bits of precision minus one values, respectively equal to:
            a first integer value from one plus two raised to the power of the number of bits of precision minus one to two raised to the power of the number of bits of precision divided by two raised to the power of the second integer value.

12. The digital circuitry of claim 3, wherein said second integer number is comprised between a minimum number and a maximum number and is equal to an increasing function of the absolute value of a difference between the conversion of the sample to a representation using the minimum number of bits.

13. The digital circuitry of claim 12, wherein said second integer number is comprised between a minimum number and a maximum number and is equal to an increasing function of the absolute value of a difference between the conversion of the sample to a representation using the minimum number of bits divided by the value of the sample.

14. The digital circuitry of claim 1, wherein the input digital signal has an input bit depth, and said output digital signal has an output bit depth, higher than or equal to the input bit depth.

15. The digital circuitry of claim 14, wherein the values of samples of the digital signal representative of the transform are integer values, said digital circuitry being configured to perform a full scale conversion of a sample of the input digital signal into a converted sample of an intermediate signal having the output bit depth, and multiply the converted sample by one or more samples of the digital signal representative of the transform.

16. The digital circuitry of claim 15, wherein the values of samples of the digital signal representative of the transform are integer values equal to suitable values having the input bit depth and belonging to a predefined set of suitable values multiplied by two raised to a power of the difference between said output bit depth and said input bit depth, said digital circuitry being configured to perform a conversion of a sample of the input digital signal into a converted sample having the output bit depth, and multiply the converted sample by values of the samples of the digital signal representative of the transform.

17. A device comprising:
    the digital circuitry of claim 14;
    a connection to a digital-to-analog converter, said digital-to-analog converter being configured to convert said output digital signal to a digital output digital signal to an output analog signal using a conversion accuracy comprised between said input bit depth and said output bit depth.

18. The device of claim 17, further comprising a connection to one or more attenuators or amplifiers to apply an amplitude change to the output analog signal using a fixed gain or a variable gain with a finite number of possible values.

19. A method of convolution of an input digital signal and a digital signal representative of a transform to obtain an output digital signal, at least one of said input digital signal and said digital signal representative of a transform comprising one or more samples obtained by a bit requirement optimization of a target digital signal.

20. A computer program product comprising computer code instructions stored on a non-transitory computer storage medium, wherein when the computer instructions are executed by one or more processors, configured the one or more processors to perform a convolution of an input digital signal and a digital signal representative of a transform to obtain an output digital signal, at least one of said input digital signal and said digital signal representative of a transform comprising one or more samples obtained by a bit requirement optimization of a target digital signal.

* * * * *